(12) United States Patent
Shah et al.

(10) Patent No.: US 11,619,661 B1
(45) Date of Patent: Apr. 4, 2023

(54) ON-DIE TECHNIQUES FOR CONVERTING CURRENTS TO FREQUENCIES

(71) Applicant: NVIDIA CORPORATION, Santa Clara, CA (US)

(72) Inventors: Nishit Harshad Shah, Sunnyvale, CA (US); Ting Ku, San Jose, CA (US); Krishnamraju Kurra, Gilroy, CA (US); Gunaseelan Ponnuvel, San Jose, CA (US); Tezaswi Raja, San Jose, CA (US); Suhas Satheesh, Sunnyvale, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/698,879

(22) Filed: Mar. 18, 2022

(51) Int. Cl.
| | | |
|---|---|---|
| *G01R 19/165* | (2006.01) | |
| *G01R 19/00* | (2006.01) | |
| *G06F 1/04* | (2006.01) | |
| *H03K 19/20* | (2006.01) | |

(52) U.S. Cl.
CPC ........... *G01R 19/16519* (2013.01); *G01R 19/0092* (2013.01); *G06F 1/04* (2013.01); *H03K 19/20* (2013.01)

(58) Field of Classification Search
CPC ............ G01R 19/0023; G01R 19/0092; G01R 19/165; G01R 19/16504; G01R 19/16519; G06F 1/04; G06F 1/10; H03K 19/20; H03K 7/06
See application file for complete search history.

(56) References Cited

U.S. PATENT DOCUMENTS

| | | |
|---|---|---|
| 4,760,287 A | 7/1988 | Goto et al. |
| 6,583,745 B2 | 6/2003 | Sakakibara et al. |
| 11,067,608 B2* | 7/2021 | Lu .............................. H03F 1/14 |
| 2008/0047025 A1 | 2/2008 | Kim et al. |
| 2017/0279357 A1* | 9/2017 | Tajima ............... G01R 19/0092 |
| 2021/0203291 A1 | 7/2021 | Lu et al. |
| 2021/0359673 A1 | 11/2021 | Coimbra et al. |

OTHER PUBLICATIONS

Non Final Office Action received for U.S. Appl. No. 17/698,867 dated Jan. 25, 2023, 12 pages.

* cited by examiner

*Primary Examiner* — Long Nguyen
(74) *Attorney, Agent, or Firm* — Artegis Law Group, LLP

(57) ABSTRACT

In various embodiments, a current measurement circuit measures an input current within an integrated circuit. The current measurement circuit includes an integration capacitor, an operational amplifier, a comparison capacitor, an inverter, and multiple switches. The current measurement circuit is coupled to a clocking circuit that, during operation, generates a two-phase clock having a frequency that is proportional to the input current. At least a portion of the switches are turned on during a first phase of the two-phase clock and are turned off during a second phase of the two-phase clock.

20 Claims, 7 Drawing Sheets

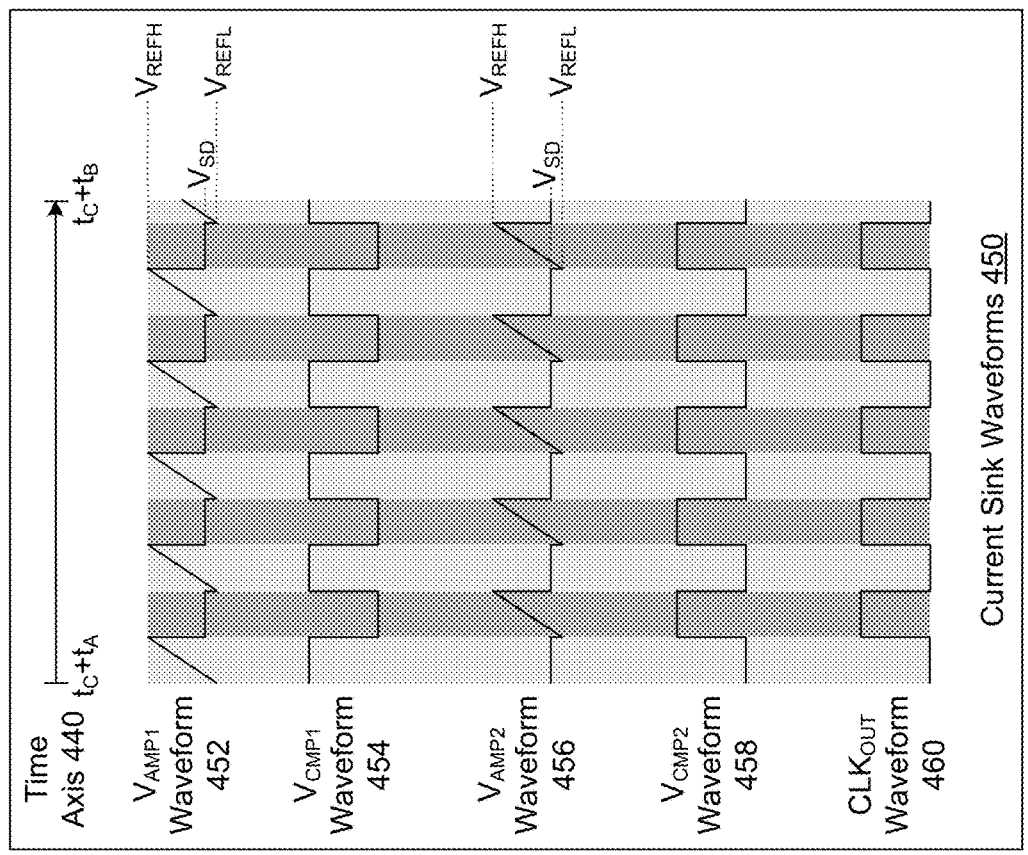
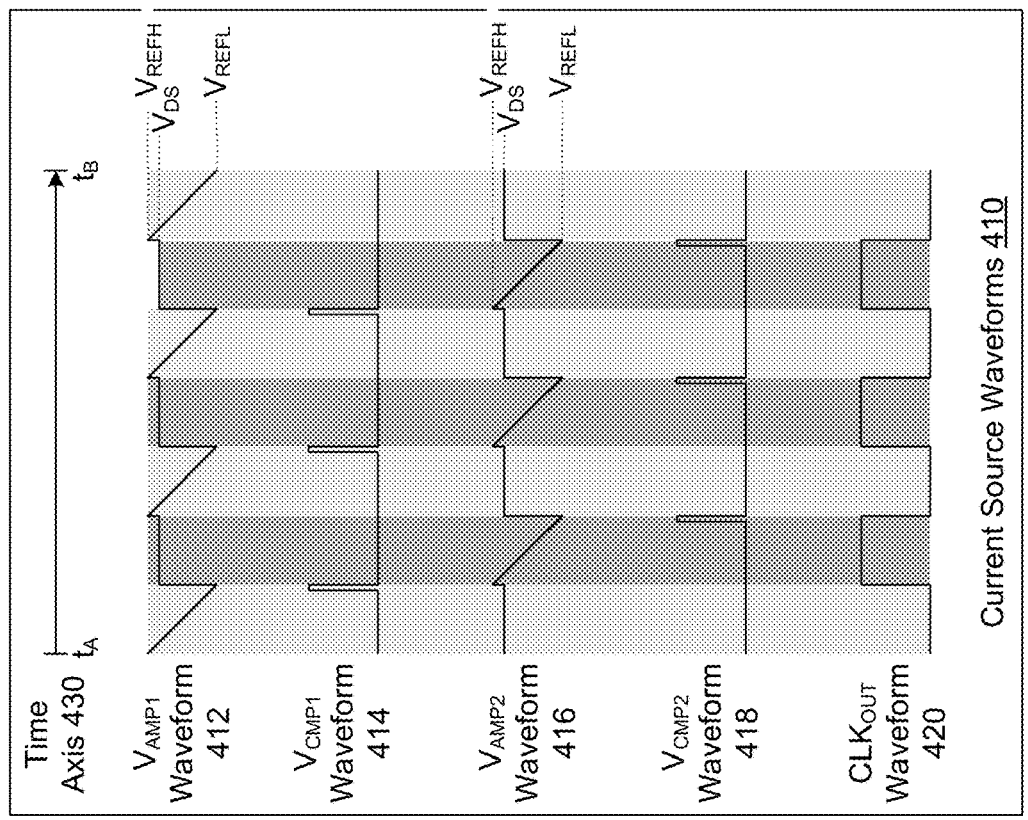
FIGURE 4B
FIGURE 4A

ON-DIE TECHNIQUES FOR CONVERTING CURRENTS TO FREQUENCIES

BACKGROUND

Field of the Various Embodiments

The various embodiments relate generally to electronics and electrical engineering and, more specifically, to on-die techniques for converting currents to frequencies.

Description of the Related Art

When fabricating integrated circuits, small variations in parameters of similarly-designed transistors oftentimes occur. These transistor mismatches can negatively impact the speed, accuracy, and power consumption of circuits and can even lead to functional failures. Ultimately, transistor mismatches can substantially reduce the percentage of the dies on which a circuit is manufactured that operate as specified—otherwise, known as the "yield" of the circuit. In an effort to increase yields, failure analysis operations are usually performed on circuits to obtain current measurements for pairs of similarly-designed transistors suspected of having transistor mismatch issues. The current measurements can be compared to verify transistor mismatches and can facilitate root cause analyses of verified transistor mismatches.

In one approach to obtaining current measurements for pairs of transistors, physical failure analysis operations are performed on one or more dies to delayer the metal layers to access mismatched transistors and build probe pads to enable access to the sources, drains, and gates of the pairs of transistors. Subsequently, electrical failure analysis operations are performed via the probe pads to collect relevant current measurements. Typically, in this approach, various voltages are applied across the transistors, and the corresponding currents through the transistors are measured and stored. One drawback of physical failure analysis is that, because the different operations are time-consuming and can be destructive to the circuitry, analyzing transistors in more than a handful of dies is usually impractical. Consequently, obtaining enough current measurement data to understand and mitigate yield losses attributable to transistor mismatches can be difficult, if not impossible. For example, delayering a single die to the point at which pairs of transistors suspected of having mismatches can be accessed, building six probe pads for each suspect pair of transistors, and measuring the behavior of the suspect transistors via the probe pads can take a week or even longer. Further, after testing, the die is no longer usable and has to be discarded.

In another approach, test matched devices that include various pairs of transistors are fabricated in the empty areas in the chips or "scribe line" that separates the different individual dies on each round slice of silicon or "wafer." Physical failure analysis operations are performed on one or more wafers to build custom pads that enable access to the test matched devices. Subsequently, electrical failure analysis operations are performed on the test matched devices using the custom pads in order to collect and store relevant current measurements. One drawback of this technique is that the spatial granularity at which the current measurements are made is relatively low and can therefore fail to provide visibility into transistor mismatches that exist within one or more dies. In particular, because the test matched devices are restricted to the empty areas in the chips or scribe line, transistor mismatches attributable to intra-die process variations cannot be determined from the data acquired from the test matched devices. Another drawback of this technique is that the physical failure analysis operations initially performed on the wafers are destructive as described above.

As the foregoing illustrates, what is needed in the art are more effective techniques for testing pairs of similarly-designed transistors within integrated circuits.

SUMMARY

One embodiment of the present invention sets forth a current measurement circuit. The current measurement circuit includes a first integration capacitor having a first terminal that is coupled to a first terminal of a first switch and having a second terminal that is coupled to both a first input terminal of a first operational amplifier and a first terminal of a second switch, where a second terminal of the second switch is coupled to a first input current; the first operational amplifier having a second input terminal that is coupled to a first voltage and having a first output terminal that is coupled to both the second terminal of the first switch and a first terminal of a third switch; a first comparison capacitor having a first terminal that is coupled to a second terminal of the third switch and having a second terminal that is coupled to an input of a first inverter; and the first inverter having an output that is coupled to a first terminal of a fourth switch, where a second terminal of the fourth switch is coupled to a clocking circuit, where, during operation, the clocking circuit generates a two-phase clock having a frequency that is proportional to the input current, and the first switch, the second switch, the third switch, and the fourth switch are turned on during a first phase of the two-phase clock and are turned off during a second phase of the two-phase clock.

At least one technical advantage of the disclosed techniques relative to the prior art is that, with the disclosed techniques, current measurements for transistors can be obtained at different spatial locations across an integrated circuit die without damaging the integrated circuit die. In that regard, with the disclosed techniques, each instance of a relatively small current monitor can sequentially generate numerous output counts, where each output count is related to the magnitude of a different current by an aggregate constant of proportionality. Accordingly, a relatively small number of instances of the current monitor can be used to collect current measurements for many pairs of similarly-designed transistors at a relatively higher spatial granularity across each integrated circuit die. Another advantage of the disclosed techniques is that, because the inputs and outputs of each instance of the current monitor can be accessed via one or more existing pads, currents across transistors within integrated circuit dies can be measured without altering the silicon, which helps maintain overall yields. Further, because no physical failure analysis operations are performed with the disclosed techniques, the overall time required to obtain current measurements for transistors can be substantially reduced relative to prior art techniques. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

FIG. 4A illustrates exemplar waveforms generated by the current-to-clock circuit of FIG. 2 when measuring a current flowing in one direction, according to various embodiments;

FIG. 4B illustrates exemplar waveforms generated by the current-to-clock circuit of FIG. 2 when measuring a current flowing in an opposite direction, according to various embodiments;

DETAILED DESCRIPTION

In the following description, numerous specific details are set forth to provide a more thorough understanding of the various embodiments. However, it will be apparent to one skilled in the art that the inventive concepts may be practiced without one or more of these specific details. For explanatory purposes only, multiple instances of like objects are denoted herein with reference numbers identifying the object and parenthetical alphanumeric character(s) identifying the instance where needed.

Figure 1:
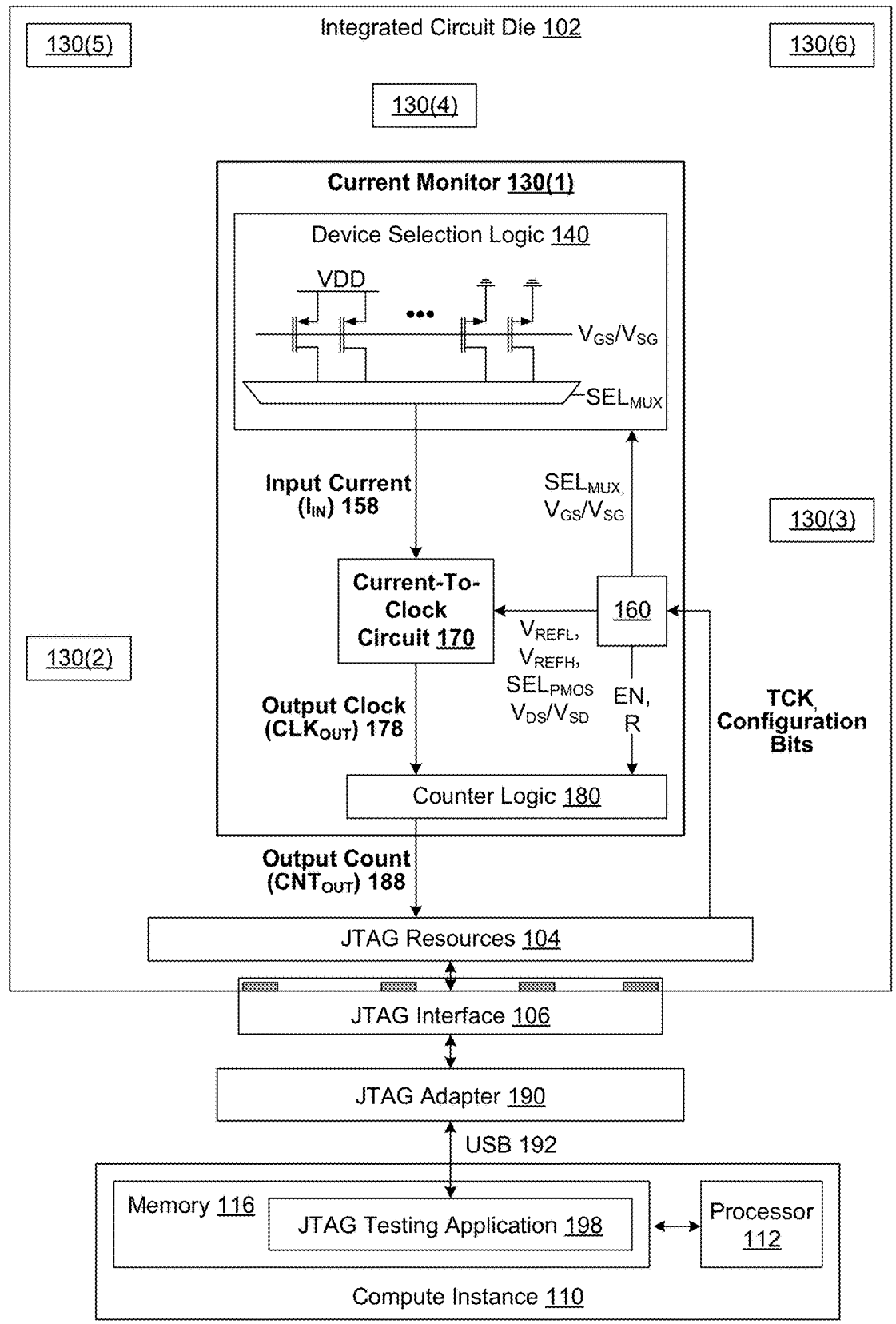
FIG. 1 is a conceptual block diagram of system in which one or more aspects of the various embodiments can be implemented.

FIG. 1 is a conceptual block diagram of system 100 in which one or more aspects of the various embodiments can be implemented. As shown, in some embodiments, the system 100 includes, without limitation, a compute instance 110, a Joint Test Action Group (JTAG) adapter 190, a Universal Serial Bus (USB) 192, and an integrated circuit die 102. In some embodiments, the system 100 can include, without limitation, one or more other compute instances in addition to the compute instance 110. In some other embodiments, the compute instance 110 can be omitted from the system 100. In some embodiments, the system 100 can include, without limitation, zero or more other integrated circuit dies that are each optionally encapsulated in a package instead of or in addition to the integrated circuit die 102. In some embodiments, the system 100 can include, without limitation, any number and/or types of components that enable off-chip communication with any number and/or types of circuits included in the integrated circuit die 102 instead of or in addition to the JTAG adapter 190 and/or the USB 192.

Any number of the components of the system 100 can be distributed across multiple geographic locations or implemented in one or more cloud computing environments (i.e., encapsulated shared resources, software, data, etc.) in any combination. In the same or other embodiments, each of the compute instance 110 and/or any number of other compute instances can be implemented in a cloud computing environment, implemented as part of any other distributed computing environment, or implemented in a stand-alone fashion.

As shown, the compute instance 110 includes, without limitation, a processor 112 and a memory 116. The processor 112 can be any instruction execution system, apparatus, or device capable of executing instructions. For example, the processor 112 could comprise a central processing unit, a graphics processing unit, a controller, a micro-controller, a state machine, or any combination thereof. The memory 116 stores content, such as software applications and data, for use by the processor 112. In some alternate embodiments, each of any number of other compute instances can include any number of instances of the processor 112 and any number of instances of the memory 116 in any combination. In particular, the compute instance 110 and/or any number of other compute instances (including one) can provide a multiprocessing environment in any technically feasible fashion.

The memory 116 can be one or more of a readily available memory, such as random-access memory, read only memory, floppy disk, hard disk, or any other form of digital storage, local or remote. In some embodiments, a storage (not shown) can supplement or replace the memory 116. The storage can include any number and type of external memories that are accessible to the processor 112. For example, and without limitation, the storage can include a Secure Digital Card, an external Flash memory, a portable compact disc read-only memory, an optical storage device, a magnetic storage device, or any suitable combination of the foregoing.

In general, the compute instance 110 is configured to implement one or more software applications. For explanatory purposes only, each software application is described as residing in the memory 116 of the compute instance 110 and executing on the processor 112 of the compute instance 110. However, in some embodiments, the functionality of any number of software applications can be distributed across any number of other software applications that reside in instances of the memory 116 of the compute instance 110 and/or any number of other compute instances and execute on any number of instances of the processor 112 of the compute instance 110 and/or any number of other compute instances in any combination. Further, the functionality of any number of software applications can be consolidated into a single software application.

In particular, in some embodiments, the compute instance 110 is configured to implement a JTAG testing application 198 that can be used to perform electrical failure analysis operations on the integrated circuit die 102. In some embodiments, the JTAG testing application 198 resides in the memory 116 of the compute instance 110 and executes on the processor 112 of the compute instance 110. As shown, in some embodiments, the JTAG testing application 198 connects to the JTAG adapter 190 via the USB 192. In the same or other embodiments, the JTAG adapter 190 can perform any number and/or types of operations to enable physical communications between the JTAG testing application 198 and the integrated circuit die 102 through a JTAG interface 106 included in the integrated circuit die 102.

In some embodiments, the integrated circuit die 102 is packaged, and the JTAG adapter 190 interfaces with package pins associated with pads included in the JTAG interface 106. In some other embodiments, the integrated circuit die 102 is not packaged, and the JTAG adapter 190 can be supplemented with or replaced by any number and/or types of components (e.g., a prober, a probe card, etc.) that collectively enable access to the pads included in the JTAG interface 106 in any technically feasible fashion. In yet other embodiments, any number and/or types of software applications, any number of connections, any number of adapters, any number of interfaces, any number of hardware components, or any combination thereof can enable a testing application to perform electrical failure analysis operations on the integrated circuit die 102 in any technically feasible fashion.

As described previously herein, many approaches to identifying, verifying, and/or determining the root cause of transistors mismatches that can negatively impact the yields of circuits involve physically modifying dies and/or wafers to enable the collection of relevant current measurements. One drawback of these types of techniques is that the physical modifications to the dies and/or wafers rarely, if ever, enable current measurements at both the scale and spatial granularity required to understand and mitigate yield losses attributable to transistors mismatches. Another drawback of these types of techniques is that the physical modifications are destructive and therefore reduce yields.

On-Die Current Monitor

To address the above issues, in some embodiments, one or more instances of a relatively small current monitor can be spatially distributed across empty spaces in each of any number of integrated circuit dies. The instances of the current monitor can measure various currents within the integrated circuit die and optionally zero or more external currents without damaging the integrated circuit die. In some embodiments, each instance of the current monitor can be independently configured after fabrication and/or packaging to obtain current measurements for any number and/or types of current sinks, any number and/or types of current sources, or any combination thereof.

In some embodiments, each current sink can be an NMOS transistor or any other type of device or circuit that is capable of sinking current, an internal connection that delivers a current having a known magnitude, or an external connection that delivers a current having a known magnitude. In the same or other embodiments, each current source can be a PMOS transistor or any other type of device or circuit that is capable of sourcing current, an internal connection that draws a current having a known magnitude, or an external connection that draws a current having a known magnitude.

In some embodiments, the current monitor includes, without limitation, a current-to-clock circuit 170 and any number (including none) and/or types of other components (e.g., circuits, logic, etc.) that facilitate obtaining current measurements from the current-to-clock circuit 170. The current-to-clock circuit 170 is also referred to herein as a "current measurement circuit." As described in greater detail below in conjunction with FIGS. 2-4B, in some embodiments, the current-to-clock circuit 170 converts an input current 158 to an output clock 178 having a frequency that is proportional to the input current 158. The input current 158 and the output clock 178 are also referred to herein as "$I_{IN}$ 158" and "$CLK_{OUT}$ 178," respectively.

In the same or other embodiments, the current source or current sink associated with input current 158 and/or any number of configuration parameters associated with the current-to-clock circuit 170 can be internally and/or externally re-configured in any technically feasible fashion and at any point in time. Accordingly, at different points in time, an instance of output clock 178 generated by each instance of the current monitor can be proportional to the currents associated with different current sinks and/or different current sources.

In the same or other embodiments, the instance of $CLK_{OUT}$ 178 generated by each instance of the current monitor can be post-processed on-die and/or off-die in any technically feasible fashion to obtain any number and/or types of current measurements in any technically feasible fashion. In some embodiments, any number and/or types of techniques can be used to determine ratiometric current measurements, constants of proportionality that relate the frequency of $CLK_{OUT}$ 178 to $I_{IN}$ 158 for different instances of the current monitor, absolute current measurements, any other type of data relevant to currents, or any combination thereof. As referred to herein, in a "ratiometric" current measurement, a first current is measured with respect to a second current to which the first current has a proportional relationship.

As described in greater detail below, in some embodiments, $CLK_{OUT}$ 178 is post-processed on-die via a counter and optionally any number and/or types of dividers to obtain an output count 188 corresponding to a fixed period of time that is referred to herein as a "monitoring period." The output count 188 is also denoted herein as $CNT_{OUT}$ 188. If the current sink or current source associated with $I_{IN}$ 158 does not change over the fixed period of time, then $CNT_{OUT}$ 188 is a frequency of $CLK_{OUT}$ 178 and is therefore proportional to $I_{IN}$ 158. If the magnitude of $I_{IN}$ 158 is known, then a constant of proportionality can be determined based on the corresponding value of $CNT_{OUT}$ 188. Based on the constant of proportionality, the values of $CNT_{OUT}$ 188 corresponding to other current sinks and/or current sources can be converted to absolute current measurements.

To enable comprehensive testing of a circuit, in some embodiments, one or more instances of the current monitor are placed at the same location and connected in the same fashion within each die on which the circuit is manufactured. For each circuit, any number of instances of the current monitor can be connected logically to any portions of the circuit and/or spatially across any number of dies on which the circuit is manufactured in any technically feasible fashion. For instance, in some embodiments, a different instance of the current monitor is connected within each chiplet in a first circuit. In the same or other embodiments, a fixed number of instances of the current monitor are distributed across the empty spaces in each die on which the first circuit or a second circuit is manufactured such that the minimum spacing between any two instances of the current monitor on the die is maximized.

Each instance of the current-to-clock circuit 170 enables the measurement of currents associated with one or more current sinks and/or current sources at one or more points in the manufacturing process. In some embodiments, any amount and/or type of interface logic on an integrated circuit die can facilitate access to each instance of the current monitor on the integrated circuit die. In the same or other embodiments, each instance of the current monitor on an integrated circuit die can be accessed any time after the integrated circuit die has been fabricated via any number and/or types of pads that are included in the integrated circuit die. In some embodiments, each instance of the current monitor on an integrated circuit die can be accessed any time after the integrated circuit die has been packaged via one or more associated pins. Notably, in some embodiments, any amount and/or types of existing, shared, and/or multi-purpose interface logic, test logic, other logic, any number of pads, any number of pins, or any combination thereof can be used to access instances of the current monitor.

Advantageously, in some embodiments, the current-to-clock circuit 170 can therefore be used to efficiently determine absolute and/or ratiometric current measurements for many pairs of similarly-designed transistors at a relatively high spatial granularity across each die without altering silicon, which helps maintain overall yields. Accordingly, in some embodiments, the current-to-clock circuit 170 enables transistor mismatches and/or associated root causes to be identified and/or verified. In the same or other embodiments, the current-to-clock circuit 170 can be used to compare the driving strengths of NMOS transistors to PMOS transistors having the same type to determine the threshold of a skewed inverter. In some embodiments, the current-to-clock circuit 170 can be used to compare the driving strengths of different flavors of transistors (e.g., low threshold voltage transistors, standard threshold voltage transistors, high threshold voltage transistors, etc.). In the same or other embodiments, the current-to-clock circuit 170 can be used to compare the driving strengths of transistors having different widths.

In some embodiments, the current-to-clock circuit 170 can be used to correlate predicted parameter variations to actual parameter variations across different portions of the integrated circuit die 102 and/or any number of other integrated circuit dies. In some embodiments, the current-to-clock circuit 170 can be used to correlate predicted parameter variations to actual parameter variations between the integrated circuit die 102 and any number of other integrated circuit dies.

As shown, in some embodiments, the integrated circuit die 102 includes, without limitation, six instances of the current monitor that are denoted as current monitor 130(1) through current monitor 130(6), the JTAG interface 106, and JTAG resources 104. For explanatory purposes, instances of the current monitor are referred to herein individually as "the current monitor 130" and collectively as "the current monitors 130." In some other embodiments, each of any number of integrated circuit dies can include, without limitation, one or more current monitors 130 and the number of current monitors 130 can vary between dies and/or between circuits. In the same or other embodiments, the JTAG interface 106 and/or the JTAG resources 104 can be modified, omitted, and/or replaced with any number (including none) and/or types of components (e.g., other interfaces, other resources, etc.).

In some embodiments, the JTAG interface 106 includes, without limitation, one or more test data input (TDI) pads, one or more test data output (TDO) pads, a test clock (TCK) pad, a test mode select (TMS) pad, and optionally a test reset pad (TRST) that can be used in conjunction with JTAG resources 104 to configure, write to, and/or read from, without limitation, the current monitors 130(1)-130(6) and optionally any number and/or types of on-die components. The JTAG resources 104 are also referred to herein as "resource logic." In some embodiments, the JTAG resources 104 include, without limitation, any number and/or types of JTAG data registers (not shown). In some embodiments, the TDI pads can be used to load data into the JTAG data registers, and the TDO pads can be used to read data from the JTAG data registers.

In some embodiments, any number and/or type of configuration bits for each of the current monitors 130 are loaded into JTAG data registers via TDI pads. As explicitly depicted for the current monitor 130(1), each current monitor 130 receives TCK from the JTAG resources 104 and reads the associated configuration bits from the JTAG data registers. In the same or other embodiments, each current monitor 130 writes $CNT_{OUT}$ 188 to the JTAG data registers after each fixed monitoring period, thereby enabling different values of $CNT_{OUT}$ 188 corresponding to different current sinks and/or different current sources to be read from the integrated circuit die 102 via the TDO pads.

As shown for the current monitor 130(1), in some embodiments, the current monitor 130 includes, without limitation, configuration logic 160, device selection logic 140, the current-to-clock circuit 170, and counter logic 180. In some embodiments, the configuration logic 160 determines $V_{REFL}$, $V_{REFH}$, $SEL_{MUX}$, $SEL_{PMOS}$, optionally $V_{GS}/V_{SG}$, and optionally $V_{DS}/V_{SD}$ in any technically feasible fashion. For instance, in some embodiments, the configuration logic 160 determines any number (including none or all) of $V_{REFL}$, $V_{REFH}$, $SEL_{MUX}$, $SEL_{PMOS}$, $V_{GS}/V_{SG}$, and $V_{DS}/V_{SD}$ based on the configuration bits. $V_{REFL}$ and $V_{REFH}$ denote a low reference voltage and a high reference voltage, respectively.

$SEL_{MUX}$ is a signal that, at any given time, selects a current associated with one of any number of current sinks and/or current sources that are associated with the current monitor 130 as $I_{IN}$ 158. If $I_{IN}$ 158 is associated with a current sink, then $SEL_{PMOS}$ is low or deasserted. If $I_{IN}$ 158 is associated with a current source, then $SEL_{PMOS}$ is high or asserted. As described in greater detail below in conjunction with FIG. 2, in some embodiments, $SEL_{PMOS}$ enables the current-to-clock circuit 170 to operate properly irrespective of whether $I_{IN}$ 158 is associated with a current sink or a current source.

In some embodiments, if $I_{IN}$ 158 is associated with a PMOS transistor, then $V_{GS}/V_{SG}$ is equal to the gate-source voltage (commonly denoted as $V_{GS}$) and $V_{DS}/V_{SD}$ is equal to the drain-source voltage (commonly denoted as $V_{DS}$). If $I_{IN}$ 158 is associated with an NMOS transistor, then $V_{GS}/V_{SG}$ is equal to the source-gate voltage (commonly denoted as $V_{SG}$), and $V_{DS}/V_{SD}$ is equal to the source-drain voltage (commonly denoted as $V_{SD}$). In some embodiments, each of $V_{GS}/V_{SG}$ and $V_{DS}/V_{SD}$ can refer to any voltage associated with $I_{IN}$ 158 and/or can be unused. In the same or other embodiments, $I_{IN}$ 158 can be selected and/or configured and the current-to-clock circuit 170 can be customized to measure any type of current in any technically feasible fashion and any number of $V_{REFL}$, $V_{REFH}$, $SEL_{MUX}$, $SEL_{PMOS}$, $V_{GS}/V_{SG}$, and $V_{GS}/V_{SG}$ can be omitted and/or replaced. As persons skilled in the art will recognize, the values of $V_{GS}/V_{SG}$ and/or $V_{GS}/V_{SG}$ can be varied or "swept" over multiple monitoring periods to generate histograms of currents of any number of PMOS transistors, any number of other current sources, any number of NMOS transistors, any number of other current sinks, or any combination thereof.

In some embodiments, the device selection logic 140 selects the current sink or current source associated with $I_{IN}$ 158 based on $SEL_{MUX}$ and optionally routes $V_{GS}/V_{SG}$ to the proper point(s) in the selected current sink or current source. The device selection logic 140 can select the current sink or current source and optionally configure the selected current sink or the selected current source based on $V_{GS}/V_{SG}$ in any technically feasible fashion.

As shown, in some embodiments, the device selection logic 140 includes, without limitation, a multiplexer having a select signal that is connected to $SEL_{MUX}$, an output that is connected to $I_{IN}$ 158, and any number of inputs. Each input of the multiplexer can be connected to a different current source or a different current sink. In some embodiments, the device selection logic 140 can optionally route $V_{GS}/V_{SG}$ to different points within each of any number of the inputs of the multiplexer. As shown, in some embodiments, the gates of multiple NMOS transistors and the gates of multiple PMOS transistors are connected to $V_{GS}/V_{SG}$. In the same or other embodiments, two different signals (e.g., $V_{GS}$ and $V_{SG}$) can be connected to the gate of any number of NMOS transistors and any number of PMOS transistors, respectively. In some embodiments, any number of pairs of similarly-designed transistors are connected to the inputs of the multiplexer to facilitate identification, verification, characterization, and/or root cause analysis of transistors mismatches.

As shown, in some embodiments, the configuration logic 160 configures the current-to-clock circuit 170 to convert $I_{IN}$ 158 to $CLK_{OUT}$ based on $V_{REFL}$, $V_{REFH}$, $SEL_{PMOS}$, and optionally $V_{GS}/V_{SG}$. Importantly, the frequency of $CLK_{OUT}$ is proportional to $I_{IN}$ 158. In some embodiments, the configuration logic 160 and/or the current-to-clock circuit 170 can implement any number and/or types of logic and/or techniques to properly connect $V_{REFL}$, $V_{REFH}$, and optionally $V_{DS}/V_{SD}$ to the current-to-clock circuit 170. In the same or other embodiments, the current-to-clock circuit 170 can implement any number and/or types of logic and/or techniques to adjust the conversion of $I_{IN}$ 158 to $CLK_{OUT}$ 178 based on $SEL_{PMOS}$.

In some embodiments, the configuration logic 160 and/or the counter logic 180 can implement any number and/or types of logic and/or techniques to ensure that, over time and different current configurations, the counter logic 180 determines values of $CNT_{OUT}$ 188 that quantify different frequencies of $CLK_{OUT}$ 178 in a consistent fashion. As used herein, "current configuration" refers to any number and/or types of parameters that influence the value of $I_{IN}$ 158. For instance, in some embodiments, each current configuration includes, without limitation, a current source or a current sink, optionally $V_{GS}/V_{SG}$, and optionally $V_{DS}/V_{SD}$. For any given current configuration, because the frequency of $CLK_{OUT}$ 178 is proportional to the corresponding $I_{IN}$ 158, the value of $CNT_{OUT}$ 188 is also proportional to the corresponding $I_{IN}$ 158. Accordingly, $CNT_{OUT}$ 188 is a current measurement metric.

The counter logic 180 can determine values of $CNT_{OUT}$ 188 in any technically feasible fashion. In some embodiments, the counter logic 180 includes, without limitation, any type of counter and optionally any amount and/or types of logic that can be configured (e.g., via the configuration bits) to pre-process $CLK_{OUT}$ 178 and/or post-process $CNT_{OUT}$ 188. For instance, in some embodiments, the counter logic 180 includes, without limitation, any number of dividers that can divide $CLK_{OUT}$ 178 by a configurable factor and route the resulting lower frequency version of $CLK_{OUT}$ 178 to the counter. In some embodiments, the counter logic 180 averages out thermal noise from the current-to-clock circuit 170.

In some embodiments, the configuration logic 160 ensures that each value of $CNT_{OUT}$ 188 is related to the corresponding value of $I_{IN}$ 158 via a single aggregate constant of proportionality. For instance, in some embodiments, the configuration logic 160 causes the counter logic 180 to accumulate values of $CNT_{OUT}$ 188 for different current configurations based on the behavior of $I_{IN}$ 158 over monitor periods having the same duration or different durations. The configuration logic 160 can configure the counter logic 180 to implement monitor periods of the same duration in any technically feasible fashion. In some embodiments, the configuration logic 160 sets the duration of each monitor period equal to M cycles of TCK, where M can be any integer. Based on TCK, the configuration logic 160 generates an enable signal and a reset signal, denoted herein as EN and R, to control the operation of the counter logic 180.

As shown, in some embodiments, to initiate a current measurement process for a current configuration specified via the configuration bits, the configuration logic 160 determines and transmits $SEL_{MUX}$ and optionally $V_{GS}/V_{SG}$ to the device selection logic 140. The configuration logic 160 also determines and transmits $V_{REFL}$, $V_{REFH}$, $SEL_{PMOS}$, and optionally $V_{DS}/V_{SD}$ to the current-to-clock circuit 170.

After the current-to-clock circuit 170 has finished initializing, the configuration logic 160 resets and then enables the counter included in the counter logic 180 via R and EN, respectively, to initiate a new current measurement. As a result, in some embodiments, the counter initializes the value of $CNT_{OUT}$ 188 to zero and then accumulates the value of $CNT_{OUT}$ 188. When the counter has been enabled for M cycles of TCK, the configuration logic 160 disables the counter. The accumulated value of $CNT_{OUT}$ is a current measurement corresponding to $I_{IN}$ 158. The counter logic 180 and/or the configuration logic 160 then stores the accumulated value of $CNT_{OUT}$ 188 in a JTAG data register. As described previously herein, in some embodiments, the stored value of $CNT_{OUT}$ 188 can be read from the JTAG data register via TDO pads. The configuration logic 160 can repeat this current measurement process to generate any number of current measurements for any number of different currents that are sequentially specified via $SEL_{MUX}$, optionally $V_{GS}/V_{SG}$, and optionally $V_{DS}/V_{SD}$.

Note that the techniques described herein are illustrative rather than restrictive and may be altered without departing from the broader spirit and scope of the invention. Many modifications and variations on the functionality provided by and/or the components included in the system 100, the integrated circuit die 102, the current monitor 130, the current-to-clock circuit 170, the configuration logic 160, the device selection logic 140, the counter logic 180, the JTAG resources 104, the JTAG interface 106, the JTAG adapter 190, the USB 192, the compute instance 110, and the JTAG testing application 198 will be apparent to those of ordinary skill in the art without departing from the scope and spirit of the described embodiments.

It will be appreciated that the system 100, the integrated circuit die 102, and the compute instance 110 shown herein are illustrative and that variations and modifications are possible. The connection topology, including the number of instances and arrangement of the integrated circuit die 102, the current monitor 130, the current-to-clock circuit 170, the configuration logic 160, the device selection logic 140, the counter logic 180, the JTAG resources 104, the JTAG interface 106, the JTAG adapter 190, the USB 192, the compute instance 110, and the JTAG testing application 198 can be modified as desired. In some embodiments, the current monitor 130, the current-to-clock circuit 170, the configuration logic 160, the device selection logic 140, the counter logic 180, the JTAG resources 104, the JTAG interface 106, the JTAG adapter 190, the USB 192, the JTAG testing application 198, or any combination thereof can be combined into fewer components implemented in any combination of hardware and software and/or partitioned across additional components. In the same or other embodiments, one or more components shown in FIG. 1 may not be present.

For instance, in some embodiments, any number and/or types of circuits (e.g., the current monitors 130(1)-130(6), the current-to-clock circuit 170, etc.) implemented in the integrated circuit die 102 can be accessed in any technically feasible fashion, and the JTAG testing application 198, the compute instance 110, the USB 192, the JTAG adapter 190, the JTAG interface 106, the JTAG resources 104, or any combination thereof may not be present. In some embodiments, one or more instances of the current-to-clock circuit 170 can be operated in a stand-alone fashion and any number of other components may not be present. In the same or other embodiments, the asynchronous comparator that is included in the current-to-clock circuit 170 can be operated in a stand-alone fashion and any number of other components may not be present.

Converting Currents to Frequencies

Figure 2:
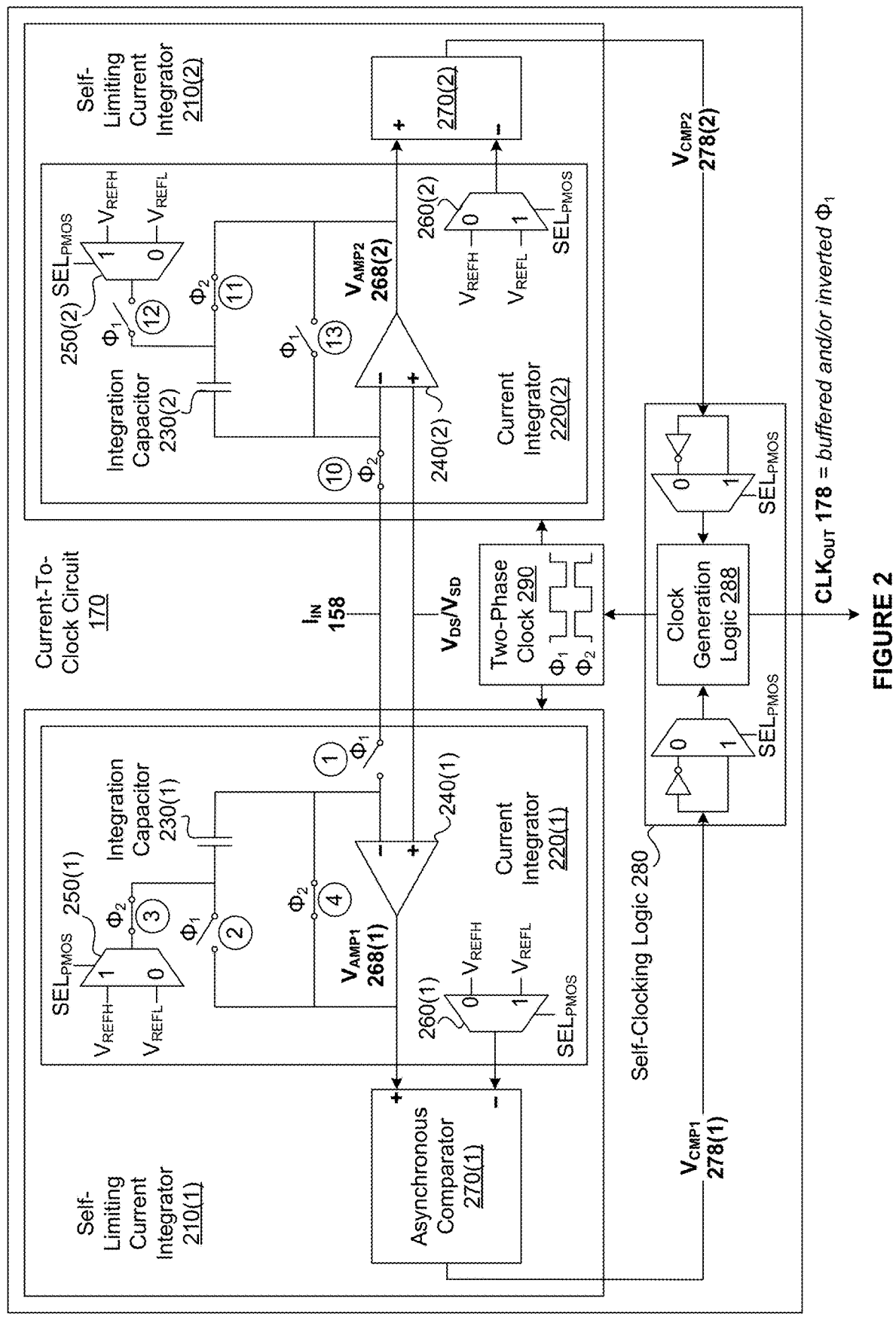
FIG. 2 is a more detailed block diagram of the current-to-clock circuit of FIG. 1, according to various embodiments.

FIG. 2 is a more detailed block diagram of the current-to-clock circuit 170 of FIG. 1, according to various embodiments. As described previously herein in conjunction with FIG. 1, in some embodiments, the current-to-clock circuit 170 generates $CLK_{OUT}$ 178 based on $I_{IN}$ 158, $V_{GS}/V_{SG}$, $SEL_{PMOS}$, $V_{REFL}$, and $V_{REFH}$. Notably, the frequency of $CLK_{OUT}$ 178 is proportional to $I_{IN}$ 158. As shown, in some embodiments, the current-to-clock circuit 170 includes, without limitation, a self-limiting current integrator 210(1), a self-limiting current integrator 210(2), and self-clocking logic 280. The self-clocking logic 280 is also referred to herein as a "clocking circuit."

In some embodiments, the self-limiting current integrator 210(1) and the self-limiting current integrator 210(2) are two instances of an similarly-designed self-limiting current integrator. As described in greater detail below, "mode" switches included in the self-limiting current integrator enable the self-limiting current integrator to operate in either a reset mode or a monitor mode. Each mode switch can be any type of device that is capable of making or breaking a connection based on a control signal and can be implemented in any technically feasible fashion at any level of hierarchy within the self-limiting current integrator.

The current-to-clock circuit 170 controls the mode switches included in the self-limiting current integrator 210(1) and the self-limiting current integrator 210(2) via a two-phase clock 290 such that the self-limiting current integrator 210(1) and the self-limiting current integrator 210(2) operate in a ping-pong fashion. As shown, based on the two-phase clock 290, $V_{GS}/V_{SG}$, $I_{IN}$ 158, $SEL_{PMOS}$, $V_{REFL}$, and $V_{REFH}$, the self-limiting current integrator 210(1) and the self-limiting current integrator 210(2) generate a first voltage comparison signal denoted $V_{CMP1}$ 278(1) and a second voltage comparison signal denoted $V_{CMP2}$ 278(2), respectively. As described in greater detail below, in some embodiments, the frequency of positive pulses of $V_{CMP1}$ 278(1) is proportional to $I_{IN}$ 158 and is approximately equal to the frequency of positive pulses of $V_{CMP2}$ 278(2). $V_{CMP1}$ 278(1) and $V_{CMP2}$ 278(2) are also referred to herein as a "first output voltage signal" and a "second output voltage signal," respectively.

As shown, in some embodiments, the self-clocking logic 280 generates the two-phase clock 290 and $CLK_{OUT}$ 178 based on $V_{CMP1}$ 278(1) and $V_{CMP2}$ 278(2). The two-phase clock 290 is a two-phase non-overlapping clock that includes, without limitation, a phase 1 signal and a phase 2 signal. The phase 1 signal is denoted herein as $\varphi 1$, and the phase 2 signal is denoted herein as $\Phi 2$. For explanatory purposes, periods of time when $\Phi 1$ is high are referred to herein as "phase 1," and periods of time when $\Phi 2$ is high are referred to herein as "phase 2." In some embodiments, a subset of the mode switches are closed or "switched on" in phase 1 and open or "switched off" otherwise, and the remainder of the mode switches are closed in phase 2 and open otherwise. In some embodiments, each of the mode switches is associated with a different control input. In the same or other embodiments, the phase 1 signal is connected to the control inputs of a subset of the mode switches and the phase 2 signal is connected to the control inputs of the remainder of the mode switches. The self-clocking logic 280 and/or the current-to-clock circuit 170 can implement any number and/or types of "break-before-make" techniques. When transitioning between phases, the break-before make techniques ensure that the mode switches that are closed immediately prior to the transition open before the other mode switches close.

In some embodiments, including the embodiments depicted in FIG. 2, each self-limiting current integrator includes, without limitation, a current integrator and an asynchronous comparator. The asynchronous comparator is also referred to herein as an "asynchronous switched capacitor comparator" and a "comparison circuit." In some embodiments, four mode switches included in the current integrator and five mode switches included in the asynchronous comparator can be configured to operate the current integrator and the asynchronous comparator, respectively, in either the reset mode or the monitor node. With respect to the asynchronous comparator, the monitor mode is also referred to herein as the "comparison mode."

To operate the self-limiting current integrator in the reset mode, both the current integrator included in the self-limiting current integrator and the asynchronous comparator included in the self-limiting current integrator are configured to operate in the reset mode. To operate the self-limiting current integrator in the monitor mode, both the current integrator included in the self-limiting current integrator and the asynchronous comparator included in the self-limiting current integrator are configured to operate in the monitor mode.

As shown, in some embodiments, the self-limiting current integrator 210(1) includes, without limitation, a current integrator 220(1) and an asynchronous comparator 270(1). The self-limiting current integrator 210(2) includes, without limitation, a current integrator 220(2) and an asynchronous comparator 270(2). The current integrator 220(1) and the current integrator 220(2) are different instances of the current integrator. The asynchronous comparator 270(1) and the asynchronous comparator 270(2) are different instances of the asynchronous comparator. For explanatory purposes only, the mode switches included in the current integrator 220(1), the asynchronous comparator 270(1), the current integrator 220(2), and the asynchronous comparator 270(2), are also referred to herein as mode switches 1-4, mode switches 5-9, mode switches 10-13, and mode switches 14-18, respectively. For explanatory purposes, the mode switches 1-4 and 10-13 are annotated in FIG. 2 with numbered bubbles.

As shown, during phase 1, the mode switches 1-9 configure the self-limiting current integrator 210(1) to operate in the monitor mode, while the mode switches 10-18 configure the self-limiting current integrator 210(2) to operate in the reset mode. During phase 2, the mode switches 1-9 configure the self-limiting current integrator 210(1) to operate in the reset mode, while the mode switches 10-18 configure the self-limiting current integrator 210(2) to operate in the monitor mode. In some embodiments, the proper operation of the self-limiting current integrator, the current integrator, and the asynchronous comparator in the monitor phase depend on reset operations that the self-limiting current integrator, the current integrator, and the asynchronous comparator, respectively, execute when operating in the reset phase. For this reason, in some embodiments, current-to-clock circuit 170 is considered to be uninitialized until the current-to-clock circuit 170 operates for at least one complete phase.

For explanatory purposes, FIG. 2 depicts the current-to-clock circuit 170 during phase 2. FIG. 2 therefore depicts the self-limiting current integrator 210(1), the current integrator 220(1), and the asynchronous comparator 270(1) when operating in the reset mode. In a complementary fashion, FIG. 2 depicts the self-limiting current integrator 210(2), the current integrator 220(2), and the asynchronous comparator 270(2) when operating in the monitor mode. Mode switches that are closed during phase 2 (and open during phase 1) are depicted with a closed switch symbol that is annotated with Φ2. Mode switches that are open during phase 2 (and closed during phase 1) are depicted with an open switch symbol annotated with φ1.

Note that the reset functionalities of the self-limiting current integrator 210(1), the current integrator 220(1), and the asynchronous comparator 270(1) as described herein are examples of functionalities that can be exhibited by any instances of the self-limiting current integrator, the current integrator, and the asynchronous comparator, respectively, when operating in the reset mode. Similarly, the monitor functionalities of the self-limiting current integrator 210(2), the current integrator 220(2), and the asynchronous comparator 270(2) as described herein are examples of functionalities that can be exhibited by any instances of the self-limiting current integrator, the current integrator, and the asynchronous comparator, respectively, when operating in the monitor mode.

In some embodiments, the current integrator 220(1) includes, without limitation, reset voltage logic 250(1), comparison voltage logic 260(1), an operational amplifier 240(1), an integration capacitor 230(1), and the mode switches 1-4. Each of the reset voltage logic 250(1) and the comparison voltage logic 260(1) can include, without limitation, any amount of logic that enables the self-limiting current integrator 210(1) to operate properly irrespective of whether $I_{IN}$ 158 is associated with a current source or a current sink. The operational amplifier 240(1) can be any type of operational amplifier. In some embodiments, the integration capacitor 230(1) can be a composite capacitor that includes, without limitation, any number and/or types of capacitors and optionally any number of other components. The reset voltage logic 250(1), the comparison voltage logic 260(1), the operational amplifier 240(1), the integration capacitor 230(1), and the mode switches 1-4 can be implemented in any technically feasible fashion.

As shown, in some embodiments, each of the reset voltage logic 250(1) and the comparison voltage logic 260(1) is a multiplexer. If $SEL_{PMOS}$ is high, then the reset voltage logic 250(1) selects $V_{REFH}$ as a reset voltage (not shown), and the comparison voltage logic 260(1) selects $V_{REFL}$ as a comparison voltage (not shown). If $SEL_{PMOS}$ is low, then the reset voltage logic 250(1) selects $V_{REFL}$ as the reset voltage, and the comparison voltage logic 260(1) selects $V_{REFR}$ as the comparison voltage.

In some embodiments, irrespective of the mode, a positive terminal of the operational amplifier 240(1) is connected to $V_{GS}/V_{SG}$, a negative terminal of the operational amplifier 240(1) is connected to a first terminal of the integration capacitor 230(1), and an output terminal of the operational amplifier 240(1) drives an output of the self-limiting current integrator 210(2) that is denoted as $V_{AMP1}$ 268(2). The positive terminal and the negative terminal of an operational amplifier are also referred to herein collectively as "input terminals" of the operational amplifier and individually as an "input terminal" of the operational amplifier.

As shown, $I_{IN}$ 158 and the negative terminal of the operational amplifier 240(1) are connected to different terminals of the mode switch 1. Mode switch 1 is open when the current integrator 220(1) is in the reset mode. Accordingly, $I_{IN}$ 158 is not connected to the negative terminal of the operational amplifier 240(1) when the current integrator 220(1) is in the reset mode. And because the mode switch 1 is the only component included in the current integrator 220(1) that is directly connected to $I_{IN}$ 158, $I_{IN}$ 158 is not connected to the current integrator 220(1) when the current integrator 220(1) is in the reset mode.

A second terminal of the integration capacitor 230(1) and $V_{AMP1}$ 268(1) are connected to different terminals of the mode switch 2. The mode switch 2 is open when the current integrator 220(1) is in the reset mode. The second terminal of the integration capacitor 230(1) and the reset voltage are connected to different terminals of the mode switch 3. The mode switch 3 is closed when the current integrator 220(1) is in the reset mode. $V_{AMP1}$ 268(1) and the negative terminal of the operational amplifier 240(1) are connected to different terminals of the mode switch 4. The mode switch 4 is closed when the current integrator 220(1) is in the reset mode, creating a feedback loop from the output terminal of the operational amplifier 240(1) to the negative terminal of the operational amplifier 240(1).

As per the mode switches 1-4, when the current integrator 220(1) is operating in the reset mode, the positive terminal of the operational amplifier 240(1) is connected to $V_{DS}/V_{SD}$, the integration capacitor 230(1) is connected between the reset voltage and the negative terminal of the operational amplifier 240(1), and $V_{AMP1}$ 268(1) is fed back to the negative terminal of the operational amplifier 240(1). As a result, the reset voltage charges the integration capacitor 230(1) as the operational amplifier 240(1) adjusts $V_{AMP1}$ 268(1) to $V_{DS}/V_{SD}$, thereby matching the negative terminal of the operational amplifier 240(1) to the positive terminal of the of the operational amplifier 240(1). As persons skilled in the art will recognize, an imbalance in charge stored in the integration capacitor 230(1) when the current integrator 220(1) is operating in the reset mode is proportional to the difference between the reset voltage and the input voltage offset of the operational amplifier 240(1).

In some embodiments, irrespective of the mode, the comparison voltage, $V_{AMP1}$ 268(1), and $V_{CMP1}$ 278(1) are connected to a negative terminal, a positive terminal, and an output, respectively, of the asynchronous comparator 270(1). In some embodiments, each instance of the asynchronous comparator includes, without limitation, an inverter, a comparison capacitor that precedes the inverter, and five mode switches. As described previously herein, the five mode switches included in the asynchronous comparator 270(1) are the mode switches 5-9.

As described in greater detail below in conjunction with FIG. 3, in some embodiments, when the asynchronous comparator is operating in the reset mode, the inverter is placed into a metastable state, the comparison capacitor is charged via the comparison voltage, and the output of the asynchronous comparator is tied to a known voltage. As persons skilled in the art will recognize, in the same or other embodiments, an imbalance in charge stored in the comparison capacitor is therefore proportional to the comparison voltage minus the threshold voltage of the transistor. In some other embodiments, the negative terminal of the asynchronous comparator can be held to a voltage other than the comparison voltage when the asynchronous comparator is operating in the reset mode.

For explanatory purposes, at any given point in time, the voltage of the negative terminal of an instance of the asynchronous comparator when the instance of the asynchronous comparator most recently operated in the reset mode is referred to herein as the "comparison reference voltage." In some embodiments, irrespective of the mode, the output of the asynchronous comparator 270(1) is also the output of the self-limiting current integrator 210(1) that, as previously noted, is denoted $V_{CMP1}$ 278(1). Accordingly, during the reset mode, the asynchronous comparator 270(1) sets $V_{CMP1}$ 278(1) low.

In some embodiments, the current integrator 220(2) includes, without limitation, reset voltage logic 250(2), comparison voltage logic 260(2), an operational amplifier 240(2), an integration capacitor 230(2), and the mode switches 5-9. The current integrator 220(1) and the current integrator 220(2) are different instances of the current integrator. Consequently, the reset voltage logic 250(2) and the reset voltage logic 250(1) are different instances of reset voltage logic (not shown), the operational amplifier 240(2) and the operational amplifier 240(1) are different instances of an operational amplifier (not shown), and the integration capacitor 230(2) and the integration capacitor 230(1) are different instances of an integration capacitor. The reset voltage logic 250(2), the comparison voltage logic 260(2), the operational amplifier 240(2), the integration capacitor 230(2), and the mode switches 5-9 can be implemented in any technically feasible fashion.

In some embodiments, if $SEL_{PMOS}$ is high (indicating a sourcing current source), then the reset voltage logic 250(2) selects $V_{REFH}$ as a reset voltage (not shown) and the comparison voltage logic 260(2) selects $V_{REFL}$ as a comparison voltage (not shown). If $SEL_{PMOS}$ is low (indicating a sinking current source), then the reset voltage logic 250(2) selects $V_{REFL}$ as the reset voltage and the comparison voltage logic 260(2) selects $V_{REFH}$ as the comparison voltage.

In some embodiments, irrespective of the mode, a positive terminal of the operational amplifier 240(2) is connected to $V_{GS}/V_{SG}$, a negative terminal of the operational amplifier 240(2) is connected to a first terminal of the integration capacitor 230(2), and an output terminal of the operational amplifier 240(2) drives an output of the self-limiting current integrator 210(2) that is denoted as $V_{AMP2}$ 268(2).

As shown, $I_{IN}$ 158 and the negative terminal of the operational amplifier 240(2) are connected to different terminals of the mode switch 10. The mode switch 10 is closed when the current integrator 220(2) is in the monitor mode. Accordingly, $I_{IN}$ 158 is connected to the negative terminal of the operational amplifier 240(2) when the current integrator 220(2) is in the monitor mode. A second terminal of the integration capacitor 230(2) and $V_{AMP2}$ 268(2) are connected to different terminals of the mode switch 11. The mode switch 11 is closed when the current integrator 220(1) is in the monitor mode.

The second terminal of the integration capacitor 230(2) and the reset voltage are connected to different terminals of the mode switch 12. The mode switch 12 is open when the current integrator 220(2) is in the monitor mode. $V_{AMP2}$ 268(2) and the negative terminal of the operational amplifier 240(2) are connected to different terminals of the mode switch 13. The mode switch 13 is open when the current integrator 220(2) is in the monitor mode.

As per the mode switches 10-13, when the current integrator 220(2) is operating in the monitor mode, the second terminal of the integration capacitor 230(2) is connected to $V_{AMP2}$ 268(2) and the first terminal of the integration capacitor 230(2) is connected to both the negative input of the operational amplifier 240(2) and $I_{IN}$ 158. Consequently, when the current integrator 220(2) is operating in the monitor mode after proper initialization, as $I_{IN}$ charges the integration capacitor 230(2), $V_{AMP2}$ 268(2) linearly transitions from the reset voltage towards the comparison voltage. More specifically, and as described in greater detail below in conjunction with FIG. 4A, if $SEL_{PMOS}$ is high, after initially rising from $V_{DS}/V_{SD}$ to $V_{REFH}$, $V_{AMP2}$ 268(2) linearly falls from $V_{REFH}$ past $V_{REFL}$ at a ramp rate that is proportional to $I_{IN}$ 158. By contrast, and as described in greater detail below in conjunction with FIGS. 4B, if $SEL_{PMOS}$ is low, after initially falling from $V_{DS}/V_{SD}$ to $V_{REFL}$, $V_{AMP2}$ 268(2) linearly rises from $V_{REFL}$ past $V_{REFH}$ at a ramp rate that is proportional to $I_{IN}$ 158.

In some embodiments, irrespective of the mode, the comparison voltage, $V_{AMP2}$ 268(2), and $V_{CMP2}$ 278(2) are connected to a negative terminal, a positive terminal, and an output, respectively, of the asynchronous comparator 270(2). The asynchronous comparator 270(2) includes, without limitation, an inverter, a comparison capacitor that precedes the inverter, and the mode switches 14-18.

In some embodiments, when the asynchronous comparator is operating in the monitor mode after operating in the reset mode, the comparison capacitor stores an imbalance in charge that is proportional to the reset voltage minus the threshold voltage of the transistor, and the output of the inverter is connected to the output of the asynchronous comparator. As described in greater detail below in conjunction with FIG. 3, in some embodiments, if the voltage of the positive terminal of the asynchronous comparator exceeds the reset voltage, then the inverter causes the output of the asynchronous comparator to decrease to or remain at a logical low. Otherwise, in the same or other embodiments, the inverter causes the output of the asynchronous comparator to increase to or remain at a logical high. A logical low and a logical high are also referred to here in as a "low logic value" and a "high logic value," Respectively.

In some embodiments, irrespective of the mode, the output of the asynchronous comparator 270(2) is also the output of the self-limiting current integrator 210(2) that, as previously noted, is denoted $V_{CMP2}$ 278(2). Accordingly, and as described in greater detail below in conjunction with FIG. 4A, if $SEL_{PMOS}$ is high, then the asynchronous comparator 270(2) drives $V_{CMP2}$ 278(2) low until $V_{AMP2}$ 268(2) decreases below $V_{REFL}$ and then drives $V_{CMP2}$ 278(2) high. By contrast, and as described in greater detail below in conjunction with FIGS. 4B, if $SEL_{PMOS}$ is low, then the asynchronous comparator 270(2) drives $V_{CMP2}$ 278(2) high until $V_{AMP2}$ 268(2) rises above $V_{REFH}$ and then drives $V_{CMP2}$ 278(2) low.

As shown, in some embodiments, the self-clocking logic 280 generates the two-phase clock 290 and $CLK_{OUT}$ 178 based on $V_{CMP1}$ 278(1), $V_{CMP2}$ 278(2), and $SEL_{PMOS}$. In the same or other embodiments, the self-clocking logic 280 includes, without limitation, a first inverter, a second inverter, a first multiplexer, a second multiplexer, and clock generation logic 288. The first inverter inverts $V_{CMP1}$ 278(1) to generate an inverted version of $V_{CMP1}$ 278(1) that is referred to herein as "$V_{CMP1}$ bar." The first multiplexer selects a first input to the self-clocking logic 280 based on $SEL_{PMOS}$. If $SEL_{PMOS}$ is high, then the first multiplexer selects $V_{CMP1}$ 278(1) as the first input to the self-clocking logic 280. If $SEL_{PMOS}$ is low, then the first multiplexer selects $V_{CMP1}$ bar as the first input to the self-clocking logic 280. The second inverter inverts $V_{CMP2}$ 278(2) to generate an inverted version of $V_{CMP2}$ 278(2) that is referred to herein as "$V_{CMP2}$ bar." The second multiplexer selects a second input to the self-clocking logic 280 based on $SEL_{PMOS}$. If $SEL_{PMOS}$ is high, then the second multiplexer selects $V_{CMP2}$ 278(2) as the second input to the self-clocking logic 280. If $SEL_{PMOS}$ is low, then the second multiplexer selects $V_{CMP2}$ bar as the second input to the self-clocking logic 280.

In some embodiments, whenever either the first input or the second input to the self-clocking logic 280 rises, the self-clocking logic 280 causes the two-phase clock 290 to switch phases. Accordingly, when the integration of $I_{IN}$ 158 during phase 2 causes $V_{AMP1}$ 268(1) to linearly ramp past the reset voltage, the first input to the self-clocking logic 280 rises, and the self-clocking logic 280 causes the two-phase clock 290 to switch from phase 2 to phase 1. In a complementary fashion, when the integration of $I_{IN}$ 158 during phase 1 causes $V_{AMP2}$ 268(1) to linearly ramp past the reset voltage, the second input to the self-clocking logic 280 rises, and the self-clocking logic 280 causes the two-phase clock 290 to switch from phase 2 to phase 1.

The self-clocking logic 280 can cause the two-phase clock 290 to switch phases in any technically feasible fashion. In some embodiments, the first input of the self-clocking logic 280 and the second input of the self-clocking logic 280 are a set input and a reset input, respectively, of a set-reset flip-flop included in the clock generation logic 288 that outputs $\Phi_1$ of the two-phase clock 290. In the same or other embodiments, the clock generation logic 288 derives $\Phi_2$ of the two-phase clock 290 from $\Phi_1$ of the two-phase clock 290 using any amount of logic to implement make-before-break techniques.

In some embodiments, the clock generation logic 288 includes, without limitation, zero or more inverters and/or zero or more buffers that invert and/or buffer $\Phi_1$ or $\Phi_2$ to generate $CLK_{OUT}$ 178. As persons skilled in the art will recognize, in some embodiments, both the frequency of positive pulses of the first input and the frequency of positive pulses of the second input are approximately equal to the frequency of $CLK_{OUT}$ 178. In the same or other embodiments, the frequency of $CLK_{OUT}$ 178 (denoted herein four) can be expressed using equation (1):

$$f_{OUT} = I_{IN}/(C \times (V_{REFH} - V_{REFL}) + k) \quad (1)$$

In equation (1), C is the capacitance of the integration capacitor and k is a constant.

The term $(C \times (V_{REFH} - V_{REFL}) + k)$ is also referred to herein as an "aggregate constant of proportionality" and denoted herein as $k_{OUT}$. The frequency of $CLK_{OUT}$ 178 can therefore be expressed using the following equation (2):

$$f_{OUT} = I_{IN}/k_{OUT} \quad (2)$$

As described previously herein in conjunction with FIG. 1, in some embodiments, for each of any number of current configurations, the current monitor 130(1) configures the current-to-clock circuit 170 to generate $CLK_{OUT}$ 178, the counter logic 180 converts $CLK_{OUT}$ 178 to $CNT_{OUT}$ 188, and the value for $CNT_{OUT}$ 188 is read via a test pin and stored as the frequency associated with the current configuration. As per equation (1), ratiometric current measurements between two values of $CNT_{OUT}$ 188 denoted herein as $CNT_{OUT1}$ and $CNT_{OUT2}$ that correspond to two currents $I_{IN1}$ and $I_{IN2}$, respectively, can be expressed using the following equation (3):

$$I_{IN1}/I_{IN2} = CNT_{OUT1}/CNT_{OUT2} \quad (3)$$

In the same or other embodiments, the current monitor 130(1) configures the current-to-clock circuit 170 to generate $CLK_{OUT}$ 178 based on a known current that is denoted herein as $I_{REF}$, the counter logic 180 converts $CLK_{OUT}$ 178 to $CNT_{OUT}$ 188, and the value for $CNT_{OUT}$ 188 is read via a test pin and stored as the frequency (denoted herein as $CNT_{REF}$) associated with the current configuration. The aggregate constant of proportionality can be computed using the following equation (4):

$$k_{OUT} = I_{REF}/CNT_{REF} \quad (4)$$

In some embodiments, absolute values of $I_{IN}$ 158 for each of any number of current configurations can be computed based on the corresponding values of $CNT_{OUT}$ 188 and the value of $k_{OUT}$ using the following equation (5):

$$I_{IN} = k_{OUT} \times CNT_{OUT} \quad (5)$$

Note that the techniques described herein are illustrative rather than restrictive and may be altered without departing from the broader spirit and scope of the invention. Many modifications and variations on the functionality provided by and/or the components included in the current-to-clock circuit 170, the self-limiting current integrator, the current integrator, the self-clocking logic 280, the clock generation logic 288, the reset voltage logic, and the comparison voltage logic will be apparent to those of ordinary skill in the art without departing from the scope and spirit of the described embodiments.

For instance, in some embodiments, the self-limiting current integrator 210(1) and the self-limiting current integrator 210(2) are not identical and/or the lengths of phase 1 and phase 2 are not equal. As persons skilled in the art will recognize, the techniques described herein can be modified to enable accurate current measurements when the lengths of both phase 1 and phase 2 are proportional to $I_{IN}$ but not necessarily equal. In the same or other embodiments, the asynchronous comparator described herein can accurately compare voltages when the mode switches are controlled via any two non-overlapping control signals.

For instance, in some embodiments, the reset voltage logic 250(1), the comparison voltage logic 260(1), the reset voltage logic 250(2), the comparison voltage logic 260(2), and the portion of the self-clocking logic 280 that selects $V_{CMP1}$ bar and $V_{CMP2}$ bar when $SEL_{PMOS}$ is low can be replaced with logic that converts input currents that flow in one direction into currents that flow in the other direction. In the same or other embodiments, the functionality provided by and/or the components included in the current-to-clock circuit 170, the self-limiting current integrator, the current integrator, the self-clocking logic 280, the clock generation logic 288, the reset voltage logic, and the comparison voltage logic can be limited to currents that flow in a single direction.

Comparing Voltages Asynchronously

Figure 3:
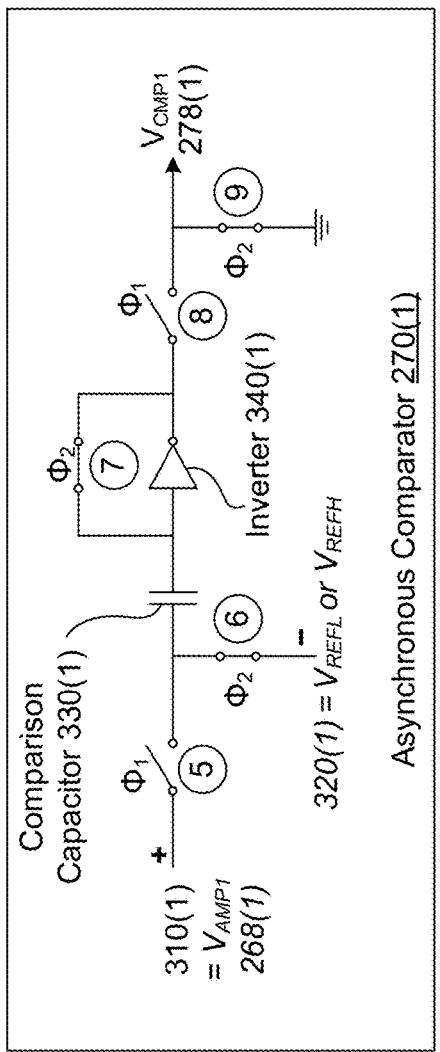
FIG. 3 is a more detailed block diagram of the asynchronous comparators of FIG. 2, according to various embodiments.
Figure 3:
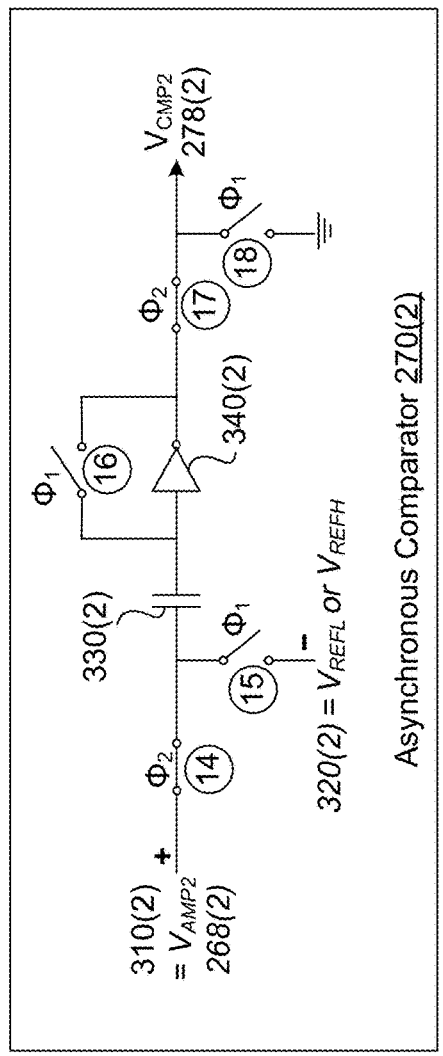

FIG. 3 is a more detailed block diagram of the asynchronous comparators of FIG. 2, according to various embodiments. More specifically, FIG. 3 depicts the asynchronous comparator 270(1) and the asynchronous comparator 270(2) that are two instances of an similarly-designed asynchronous comparator. For explanatory purposes, FIG. 3 depicts the asynchronous comparator 270(1) and the asynchronous comparator 270(2) when operating in the reset mode and the monitor mode, respectively.

Note that, the reset functionality of the asynchronous comparator 270(1) described herein is an example of functionality that can be exhibited by any instances of asynchronous comparator (including the asynchronous comparator 270(2)) when operating in the reset mode. Similarly, the monitor functionality of the asynchronous comparator 270(2) described herein is an example of functionality that can be exhibited by any instances of asynchronous comparator (including the asynchronous comparator 270(1)) when operating in the monitor mode.

Referring back to FIG. 2, in some embodiments, the asynchronous comparator 270(1) is configured to operate in either the reset mode or the monitor mode via the mode switches 5-9. In the same or other embodiments, the asynchronous comparator 270(1) is configured to operate in either the reset mode or the monitor mode via the mode switches 14-18. For explanatory purposes, the mode switches 5-9 and 14-18 are annotated in FIG. 3 with bubbles that are numbered 5-9 and 14-18, respectively.

As shown, in some embodiments, the asynchronous comparator 270(1) has two inputs, a positive terminal 310(1) and a negative terminal 320(1), and a single output, $V_{CMP1}$ 278(1). The signals that the asynchronous comparator receives via the positive terminal and the negative terminal are also referred to herein as a "sense signal" and a "reference signal," respectively. The voltage of the reference signal is also referred to herein as "the reference voltage." The signal that the asynchronous comparator outputs is also referred to herein as a "comparison result signal." The signals that control the mode switches included in the asynchronous comparator are also referred to herein as "mode control signals."

Referring back to FIG. 2 and as depicted in italics in FIG. 3, in some embodiments, $V_{AMP1}$ 268(1) is connected to the positive terminal 310(1), and the comparison voltage (either $V_{REFL}$ or $V_{REFH}$) is connected to the negative terminal 320(1). In the same or other embodiments, the asynchronous comparator 270(1) includes, without limitation, the mode switches 5-9, a comparison capacitor 330(1), and an inverter 340(1).

In some embodiments, the comparison capacitor 330(1) can be a single capacitor or a composite capacitor that includes, without limitation, any number and/or types of capacitors and optionally any number of other components. Irrespective of the mode, the comparison capacitor 330(1) is connected to and precedes the inverter 340(1). As depicted, the positive terminal 310(1) and a first terminal of the comparison capacitor 330(1) are connected to different terminals of the mode switch 5. As shown, the mode switch 5 is open when the asynchronous comparator 270(1) is in the reset mode. Accordingly, the asynchronous comparator 270(1) does not use the positive terminal 310(1) when operating in the reset mode.

The negative terminal 320(1) and the first terminal of the comparison capacitor 330(1) are connected to different terminals of the mode switch 6. As shown, the mode switch 6 is closed when the asynchronous comparator 270(1) is in the reset mode. Accordingly, the reference signal (having the reference voltage) drives the first terminal of the comparison capacitor 330(1). The output of the inverter 340(1) and the input of the inverter 340(1) are connected to different terminals of the mode switch 7. When the asynchronous comparator 270(1) is operating in the reset mode, the mode switch 7 is closed and therefore the output of the inverter 340(1) is fed back to the input of the inverter 340(1).

The output of the inverter 340(1) and $V_{CMP1}$ 278(1) are connected to different terminals of the mode switch 8. As shown, the mode switch 8 is open when the asynchronous comparator 270(1) is in the reset mode. $V_{CMP1}$ 278(1) and a ground voltage are connected to different terminals of the mode switch 9. When the asynchronous comparator 270(1) is operating in the reset mode, the mode switch 9 is closed and therefore $V_{CMP1}$ 278(1) is tied to the ground voltage (and is therefore held at a logical low).

As per the depicted mode switches 5-9, when the asynchronous comparator 270(1) is operating in the reset mode, the comparison capacitor 330(1) is connected between the negative terminal 320(1) and the input of the inverter 340(1), the output of the inverter 340(1) is fed back to the input of the inverter 340(1), and $V_{CMP1}$ 278(1) is held at a logical low. As a result, the inverter 340(1) is in a metastable state, and the comparison capacitor 330(1) stores an imbalance in charge that is proportional to the voltage of the negative terminal 320(1) minus the threshold voltage of the inverter 340(1). The comparison reference voltage is therefore equal to the voltage of the negative terminal 320(1).

As shown, in the same or other embodiments, the asynchronous comparator 270(2) has two inputs, a positive terminal 310(2) and a negative terminal 320(2), and a single output, $V_{CMP2}$ 278(2). Referring back to FIG. 2 and as depicted in italics in FIG. 3, in some embodiments, $V_{AMP2}$ 268(2) is connected to the positive terminal 310(2), and the comparison voltage (either $V_{REFL}$ or $V_{REFH}$) is connected to the negative terminal 320(2). More precisely, $V_{REFL}$ is selected for a sourcing current source and $V_{REFH}$ is selected for a sinking current source. In the same or other embodiments, the asynchronous comparator 270(2) includes, without limitation, the mode switches 14-19, a comparison capacitor 330(2), and an inverter 340(2).

In some embodiments, the comparison capacitor 330(2) can be a single capacitor or a composite capacitor that includes, without limitation, any number and/or types of capacitors and optionally any number of other components. Irrespective of the mode, the comparison capacitor 330(2) is connected to and precedes the inverter 340(2). As depicted, the positive terminal 310(2) and a first terminal of the comparison capacitor 330(2) are connected to different terminals of the mode switch 14. As shown, the mode switch 14 is closed when the asynchronous comparator 270(2) is in the monitor mode. Accordingly, the sense signal drives the first terminal of the comparison capacitor 330(1).

The negative terminal 320(2) and the first terminal of the comparison capacitor 330(2) are connected to different terminals of the mode switch 15. As shown, the mode switch 15 is open when the asynchronous comparator 270(2) is in the monitor mode. Accordingly, the asynchronous comparator 270(2) does not use the negative terminal 320(2) when operating in the monitor mode.

The output of the inverter 340(2) and the input of the inverter 340(2) are connected to different terminals of the mode switch 16. When the asynchronous comparator 270(2) is operating in the reset mode, the mode switch 16 is open and therefore the output of the inverter 340(2) is not fed back to the input of the inverter 340(2).

The output of the inverter 340(2) and $V_{CMP2}$ 278(2) are connected to different terminals of the mode switch 17. As shown, when the asynchronous comparator 270(2) is operating in the monitor mode, the mode switch 17 is closed and therefore the output of the inverter 340(2) drives $V_{CMP2}$ 278(2). $V_{CMP2}$ 278(2) and a ground voltage are connected to different terminals of the mode switch 18. When the asynchronous comparator 270(2) is operating in the monitor mode, the mode switch 18 is open.

As per the depicted mode switches 14-18, when the asynchronous comparator 270(2) is operating in the monitor mode, the comparison capacitor 330(2) is connected between the positive terminal 310(2) and the input of the inverter 340(2), and the output of the inverter 340(2) drives $V_{CMP2}$ 278(2). As described previously herein in the context of the asynchronous comparator 270(1), if the asynchronous comparator 270(2) previously operated in the reset mode, then the comparison capacitor 330(2) stores an imbalance in charge that is proportional to the comparison reference voltage minus the threshold voltage of the inverter 340(2). Consequently, during the monitor mode and in some embodiments, if the voltage of the positive terminal 310(2) exceeds the comparison reference voltage, then the inverter 340(2) causes $V_{CMP2}$ 278(2) to decrease to or remain at a logical low. Otherwise, in the same or other embodiments, the inverter 340(2) causes $V_{CMP2}$ 278(2) to increase to or remain at a logical high.

In some other embodiments, any number of instances of the asynchronous comparator can operate within any number of instances of the self-limiting current integrator, in a stand-alone fashion, as components within any number and/or types of circuits, or any combination thereof. When used in a stand-alone fashion, an instance of the asynchronous comparator can be operated in the reset mode to cause a comparison capacitor to store an imbalance in charge that is proportional to the voltage of the negative terminal minus the threshold voltage of the transistor. And the instance of the asynchronous comparator can be operated in the monitor mode to compare the voltage of the positive terminal to the voltage at which the negative terminal was held during the preceding reset mode.

FIG. 4A illustrates exemplar waveforms generated by the current-to-clock circuit 170 of FIG. 2 when measuring a current flowing in one direction, according to various embodiments. More specifically, in some embodiments, current source waveforms 410 are examples of waveforms generated by the current-to-clock circuit 170 when $I_{IN}$ 158 is associated with a current source. As described previously herein in conjunction with FIG. 1, the configuration logic 160 sets $SEL_{PMOS}$ high when $I_{IN}$ 158 is associated with a current source. Because $SEL_{PMOS}$ is high, both the self-limiting current integrator 210(1) and the self-limiting current integrator 210(2) select $V_{REFH}$ as the reset voltage and $V_{REFL}$ as the comparison voltage.

Because $SEL_{PMOS}$ is high, whenever either $V_{CMP1}$ 278(1) or $V_{CMP2}$ 278(2) rises, the self-clocking logic 280 causes the two-phase clock 290 to switch phases and $CLK_{OUT}$ 178 to toggle. In some embodiments, including embodiments depicted in FIG. 4A, when $SEL_{PMOS}$ is high, the self-clocking logic 280 causes $CLK_{OUT}$ 178 to rise whenever $V_{CMP1}$ 278(1) rises and $CLK_{OUT}$ 178 to fall whenever $V_{CMP2}$ 278(2) rises. In some other embodiments, when $SEL_{PMOS}$ is high, the self-clocking logic 280 causes $CLK_{OUT}$ 178 to fall whenever $V_{CMP1}$ 278(1) rises and $CLK_{OUT}$ 178 to rise whenever $V_{CMP2}$ 278(2) rises.

The current source waveforms 410 include, without limitation, a $V_{AMP1}$ waveform 412, a $V_{CMP1}$ waveform 414, a $V_{AMP2}$ waveform 416, a $V_{CMP2}$ waveform 418, and a $CLK_{OUT}$ waveform 420 corresponding to $V_{AMP1}$ 268(1), $V_{CMP1}$ 278(1), $V_{AMP2}$ 268(2), $V_{CMP2}$ 278(2), and $CLK_{OUT}$ 178, respectively. The current source waveforms 410 are depicted along a time axis 430 from a point in time denoted as $t_A$ to a point in time denoted as $t_B$. The point in time $t_A$ occurs after the current-to-clock circuit 170 finishes initializing and is coincident with a transition from phase 2 to phase 1 of the two-phase clock 290 (not shown in FIG. 4A). For explanatory purposes, the portions of the current source waveforms 410 corresponding to phase 1 of the two-phase clock 290 are lightly shaded and the portions of the current source waveforms 410 corresponding to phase 2 of the two-phase clock 290 are darkly shaded.

As described previously herein in conjunction with FIG. 2, in some embodiments, the current integrator 220(1) and the asynchronous comparator 270(1) operate in the measure mode during phase 1. During phase 1 and as depicted in each lightly shaded portion of the $V_{AMP1}$ waveform 412, $V_{AMP1}$ 268(1) linearly decreases from $V_{REFH}$ at a ramp rate that is proportional to $I_{IN}$ 158 until $V_{AMP1}$ 268(1) passes $V_{REFL}$. During phase 1 and as depicted in each lightly shaded portion of the $V_{CMP1}$ waveform 414, $V_{CMP1}$ 278(1) is low until $V_{AMP1}$ 268(1) decreases below $V_{REFL}$ and then $V_{CMP1}$ 278(1) rises. When $V_{CMP1}$ 278(1) rises, the self-clocking logic 280 causes the two-phase clock 290 to switch from phase 1 to phase 2 and $CLK_{OUT}$ 178 to toggle (depicted at each transition from a lightly shaded portion of the $CLK_{OUT}$ waveform 420 to a darkly shaded portion of the $CLK_{OUT}$ waveform 420).

As described previously herein in conjunction with FIG. 2, in some embodiments, the current integrator 220(2) and the asynchronous comparator 270(2) operate in the reset mode during phase 1. During phase 1 and as depicted in each lightly shaded portion of the $V_{AMP2}$ waveform 416, the current integrator 220(2) drives $V_{AMP2}$ 268(2) to $V_{DS}$. As depicted in each lightly shaded portion of the $V_{CMP2}$ waveform 418, the asynchronous comparator 270(2) sets $V_{CMP2}$ 278(2) low during phase 1.

In some embodiments (described previously herein in conjunction with FIG. 2), the current integrator 220(1) and the asynchronous comparator 270(1) operate in the reset mode during phase 2. During phase 2 and as depicted in each darkly shaded portion of the $V_{AMP1}$ waveform 412, the current integrator 220(1) drives $V_{AMP1}$ 268(1) to $V_{DS}$. As depicted in each darkly shaded portion of the $V_{CMP1}$ waveform 414, the asynchronous comparator 270(1) ties $V_{CMP1}$ 278(1) low during phase 2.

As described previously herein in conjunction with FIG. 2, in some embodiments, the current integrator 220(2) and the asynchronous comparator 270(2) operate in the measure mode during phase 2. During phase 2 and as depicted in each darkly shaded portion of the $V_{AMP2}$ waveform 416, $V_{AMP2}$ 268(2) linearly decreases from $V_{REFH}$ at a ramp rate that is proportional to $I_{IN}$ 158 until $V_{AMP2}$ 268(2) passes $V_{REFL}$. As depicted in each darkly shaded portion of the $V_{CMP2}$ waveform 418, during phase 2, $V_{CMP2}$ 278(2) is low until $V_{AMP2}$ 268(2) decreases below $V_{REFL}$ and then $V_{CMP2}$ 278(2) rises. When $V_{CMP2}$ 278(2) rises, the self-clocking logic 280 causes the two-phase clock 290 to switch phases and causes $CLK_{OUT}$ 178 to toggle (depicted at each transition from a darkly shaded portion of the $CLK_{OUT}$ waveform 420 to a lightly shaded portion of the $CLK_{OUT}$ waveform 420).

FIG. 4B illustrates exemplar waveforms generated by the current-to-clock circuit 170 of FIG. 2 when measuring a current flowing in an opposite direction, according to various embodiments. More specifically, in some embodiments, current sink waveforms 450 are examples of waveforms generated by the current-to-clock circuit 170 when $I_{IN}$ 158 is associated with a currentسink. As described previously herein in conjunction with FIG. 1, the configuration logic 160 sets $SEL_{PMOS}$ low when $I_{IN}$ 158 is a current sink. Because $SEL_{PMOS}$ is low, both the self-limiting current integrator 210(1) and the self-limiting current integrator 210(2) select $V_{REFL}$ as the reset voltage and $V_{REFH}$ as the comparison voltage.

Also because $SEL_{PMOS}$ is low, whenever either $V_{CMP1}$ 278(1) or $V_{CMP2}$ 278(2) falls, the self-clocking logic 280 causes the two-phase clock 290 to switch phases and $CLK_{OUT}$ 178 to toggle. In some embodiments, including embodiments depicted in FIG. 4B, when $SEL_{PMOS}$ is low, the self-clocking logic 280 causes $CLK_{OUT}$ 178 to rise whenever $V_{CMP1}$ 278(1) falls and $CLK_{OUT}$ 178 to fall whenever $V_{CMP2}$ 278(2) falls. In some other embodiments, $SEL_{PMOS}$, is low and the self-clocking logic 280 causes $CLK_{OUT}$ 178 to fall whenever $V_{CMP1}$ 278(1) rises and $CLK_{OUT}$ 178 to rise whenever $V_{CMP2}$ 278(2) rises.

The current sink waveforms 450 include, without limitation, a $V_{AMP1}$ waveform 452, a $V_{CMP1}$ waveform 454, a $V_{AMP2}$ waveform 456, a $V_{CMP2}$ waveform 458, and a $CLK_{OUT}$ waveform 460 corresponding to $V_{AMP1}$ 268(1), $V_{CMP1}$ 278(1), $V_{AMP2}$ 268(2), $V_{CMP2}$ 278(2), and $CLK_{OUT}$ 178, respectively. For explanatory purposes, the magnitude of $I_{IN}$ 158 depicted in FIG. 4B is larger than the magnitude of $I_{IN}$ 158 depicted in FIG. 4A. Relative to the current source waveforms 410, the current sink waveforms 450 therefore depict versions of $V_{AMP1}$ 268(1), $V_{CMP1}$ 278(1), $V_{AMP2}$ 268(2), $V_{CMP2}$ 278(2), and $CLK_{OUT}$ 178 that have higher frequencies.

To effectively illustrate the frequency differences between signals depicted in FIGS. 4A and 4B, the current sink waveforms 450 are depicted in FIG. 4B for the same length of time as the current source waveforms 410 are depicted in FIG. 4A. More specifically, the current sink waveforms 450 are depicted along a time axis 440 from a point in time denoted as $t_C+t_A$ to a point in time denoted as $t_C+t_B$. The point in time $t_C+t_A$ occurs after the current-to-clock circuit 170 finishes initializing. For explanatory purposes, the portions of the current sink waveforms 450 corresponding to phase 1 of the two-phase clock 290 are lightly shaded and the portions of the current sink waveforms 450 corresponding to phase 2 of the two-phase clock 290 are darkly shaded.

As described previously herein in conjunction with FIG. 2, in some embodiments, the current integrator 220(1) and the asynchronous comparator 270(1) operate in the measure mode during phase 1. During phase 1 and as depicted in each lightly shaded portion of the $V_{AMP1}$ waveform 452, $V_{AMP1}$ 268(1) linearly increases from $V_{REFL}$ at a ramp rate that is proportional to $I_{IN}$ 158 until $V_{AMP1}$ 268(1) passes $V_{REFR}$. During phase 1 and as depicted in each lightly shaded portion of the $V_{CMP1}$ waveform 454, $V_{CMP1}$ 278(1) is high until $V_{AMP1}$ 268(1) increases above $V_{REFH}$ and then $V_{CMP1}$ 278(1) falls. When $V_{CMP1}$ 278(1) falls, the self-clocking logic 280 causes the two-phase clock 290 to switch from phase 1 to phase 2 and $CLK_{OUT}$ 178 to toggle (depicted at each transition from a lightly shaded portion of the $CLK_{OUT}$ waveform 460 to a darkly shaded portion of the $CLK_{OUT}$ waveform 460).

As described previously herein in conjunction with FIG. 2, in some embodiments, the current integrator 220(2) and the asynchronous comparator 270(2) operate in the reset mode during phase 1. During phase 1 and as depicted in each lightly shaded portion of the $V_{AMP2}$ waveform 456, the current integrator 220(2) drives $V_{AMP2}$ 268(2) to $V_{SD}$. During phase 1, and as depicted in each lightly shaded portion of the $V_{CMP2}$ waveform 458, the asynchronous comparator 270(2) sets $V_{CMP2}$ 278(2) low.

In some embodiments (described previously herein in conjunction with FIG. 2), the current integrator 220(1) and the asynchronous comparator 270(1) operate in the reset mode during phase 2. During phase 2 and as depicted in each darkly shaded portion of the $V_{AMP1}$ waveform 452, the current integrator 220(1) drives $V_{AMP1}$ 268(1) to $V_{SD}$. As depicted in each darkly shaded portion of the $V_{CMP1}$ waveform 454, the asynchronous comparator 270(1) ties $V_{CMP1}$ 278(1) low during phase 2.

As described previously herein in conjunction with FIG. 2, in some embodiments, the current integrator 220(2) and the asynchronous comparator 270(2) operate in the measure mode during phase 2. During phase 2 and as depicted in each darkly shaded portion of the $V_{AMP2}$ waveform 456, $V_{AMP2}$ 268(2) linearly increases from $V_{REFL}$ at a ramp rate that is proportional to $I_{IN}$ 158 until $V_{AMP2}$ 268(2) passes $V_{REFH}$. As depicted in each darkly shaded portion of $V_{CMP2}$ waveform 458, during phase 2, $V_{CMP2}$ 278(2) is high until $V_{AMP2}$ 268(2) increases above $V_{REFH}$ and then $V_{CMP2}$ 278(2) falls. When $V_{CMP2}$ 278(2) falls, the self-clocking logic 280 causes the two-phase clock 290 to switch phases and causes $CLK_{OUT}$ 178 to toggle (depicted at each transition from a darkly shaded portion of the $CLK_{OUT}$ waveform 460 to a lightly shaded portion of the $CLK_{OUT}$ waveform 460).

Figure 5A:
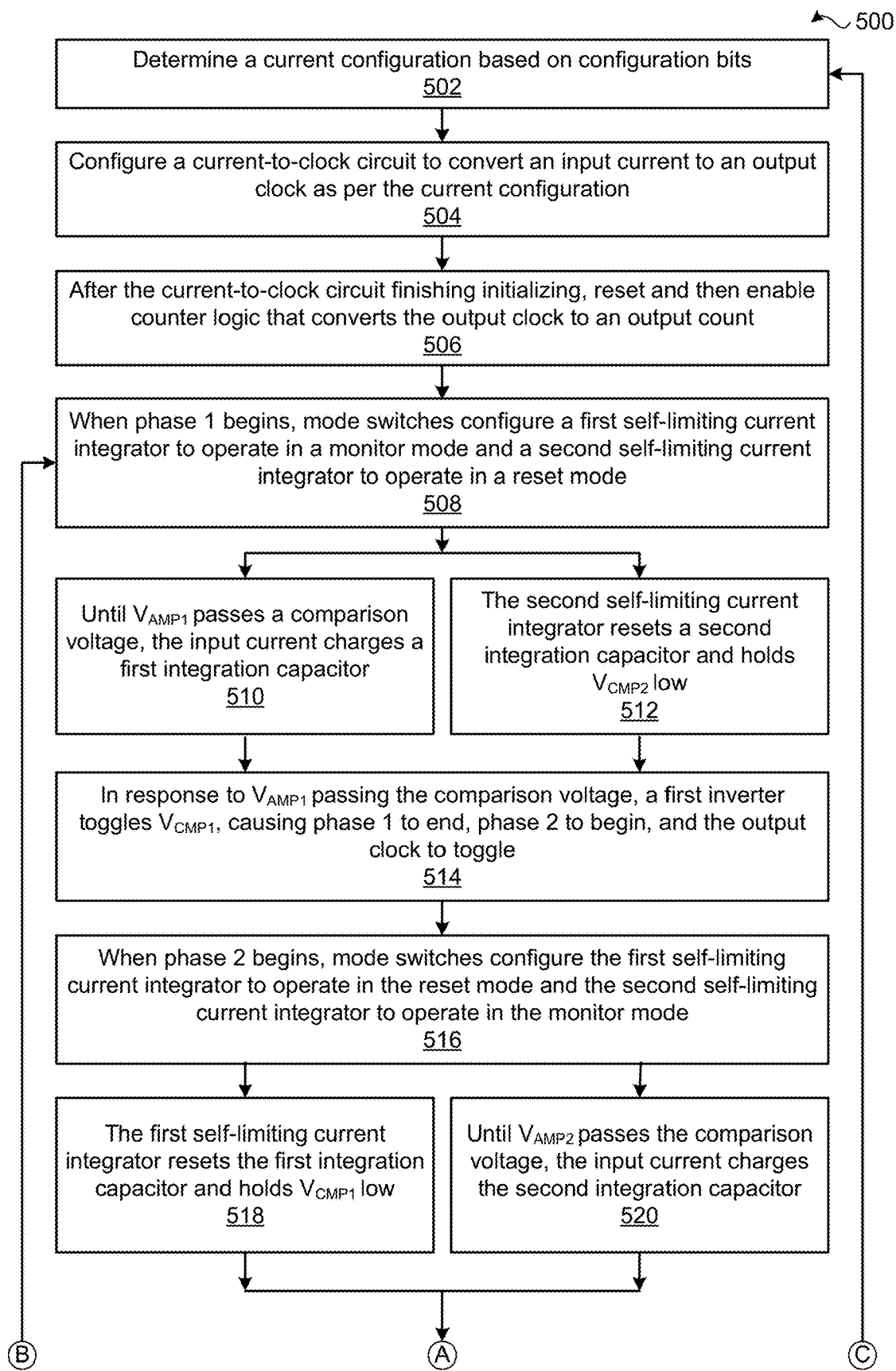
FIG. 5A-5B set forth a flow diagram of method steps for measuring one or more currents within an integrated circuit, according to various embodiments.
Figure 5B:
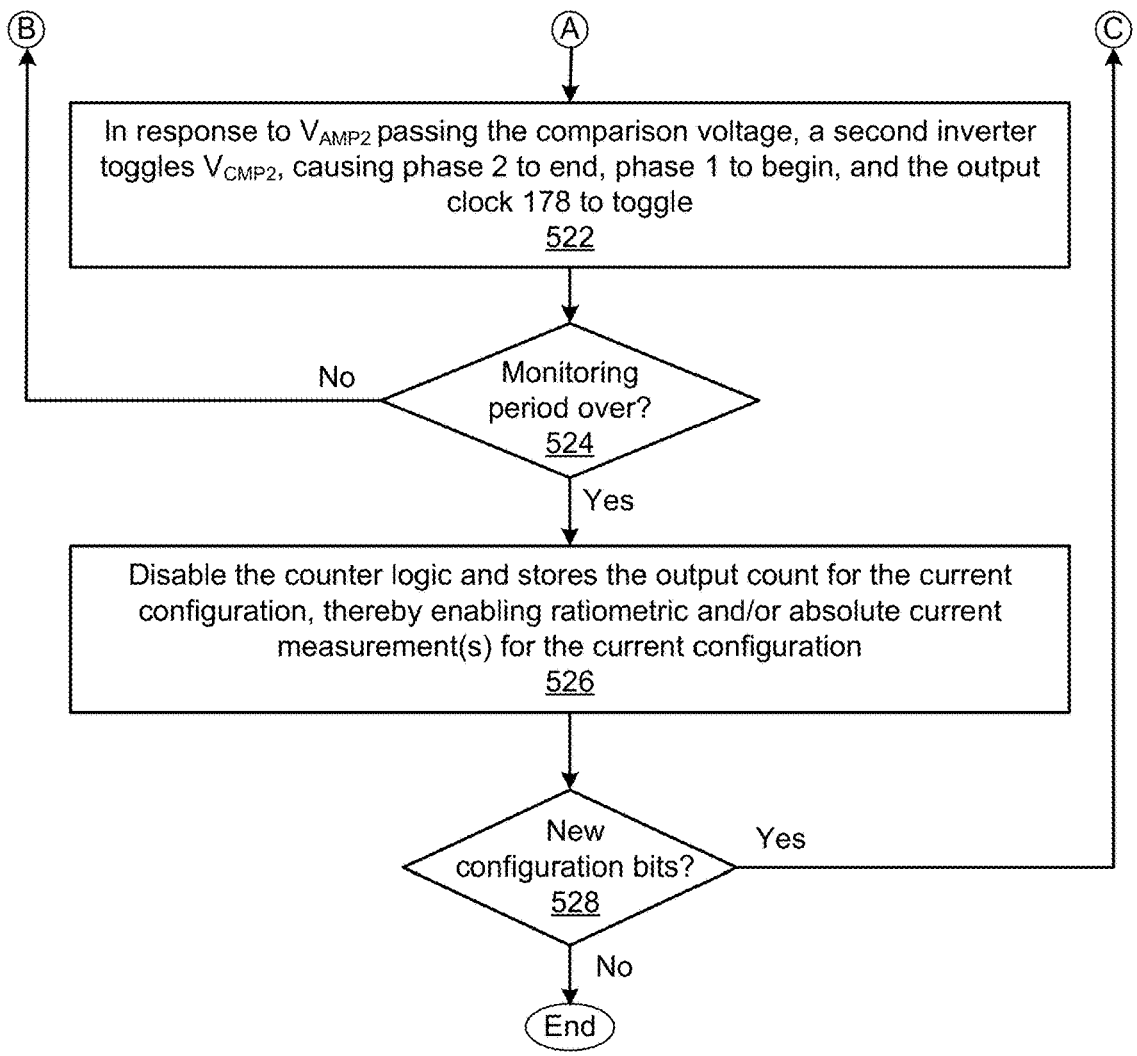

FIGS. 5A-5B set forth a flow diagram of method steps for measuring one or more currents within an integrated circuit, according to various embodiments. Although the method steps are described with reference to the systems of FIGS. 1-4B, persons skilled in the art will understand that any system configured to implement the method steps, in any order, falls within the scope of the present invention.

As shown, a method 500 begins at step 502, where the current monitor 130 determines a current configuration based on configuration bits received via any number of pads. At step 504, the current monitor 130 configures the current-to-clock circuit 170 to convert the input current 158 to the output clock 178 as per the current configuration. At step 506, after the current-to-clock circuit 170 finishes initializing, the current monitor 130 enables and then resets the counter logic 180 that converts the output clock 178 to the output count 188. self-limiting current integrator At step 508, when phase 1 begins, mode switches configure the self-limiting current integrator 210(1) to operate in the monitor mode and the self-limiting current integrator 210(2) to operate in the reset mode. At step 510, until $V_{AMP1}$ 268(1) passes the comparison voltage, the input current 158 charges the integration capacitor 230(1). At step 512, the self-limiting current integrator 210(2) resets the integration capacitor 230(2) and holds $V_{CMP2}$ 278(2) low. At step 514, in response to $V_{AMP1}$ 268(1) passing the comparison voltage, the inverter 340(1) toggles $V_{CMP1}$ 278(1), causing phase 1 to end, phase 2 to begin, and the output clock 178 to toggle.

At step 516, when phase 2 begins, mode switches configure the self-limiting current integrator 210(1) to operate in the reset mode and the self-limiting current integrator 210(1) to operate in the monitor mode. At step 518, the self-limiting current integrator 210(1) resets the integration capacitor 230(1) and holds $V_{CMP1}$ 278(1) low. At step 520, until $V_{AMP2}$ 268(2) passes the comparison voltage, the input current 158 charges the integration capacitor 230(2). At step 522, in response to $V_{AMP2}$ 268(2) passing the comparison voltage, the inverter 340(2) toggles $V_{CMP2}$ 278(2), causing phase 2 to end, phase 1 to begin, and the output clock 178 to toggle At step 524, the current monitor 130 determines whether the monitoring period is over. If, at step 524, the current monitor 130 determines that the monitoring period is not over, then the method 500 returns to step 508, where the mode switches configure the self-limiting current integrator 210(1) to operate in the monitor mode and the self-limiting current integrator 210(2) to operate in the reset mode.

If, however, at step 524, the current monitor 130 determines that the monitoring period is over, then the method 500 proceeds to step 526. At step 526, the current monitor 130 disables the counter and stores the output count 188 for the current configuration, thereby enabling ratiometric and/or absolute current measurement(s) for the current configuration.

At step 528, the current monitor 130 determines whether the current monitor 130 has received new configuration bits. If, at step 528, the current monitor 130 determines that the current monitor 130 has received new configuration bits, then the method 500 returns to step 502, where the current monitor 130 determines the current configuration based on configuration bits. If, however, at step 528, the current monitor 130 determines that the current monitor 130 has not received new configuration bits, then the method 500 ends.

Figure 6:
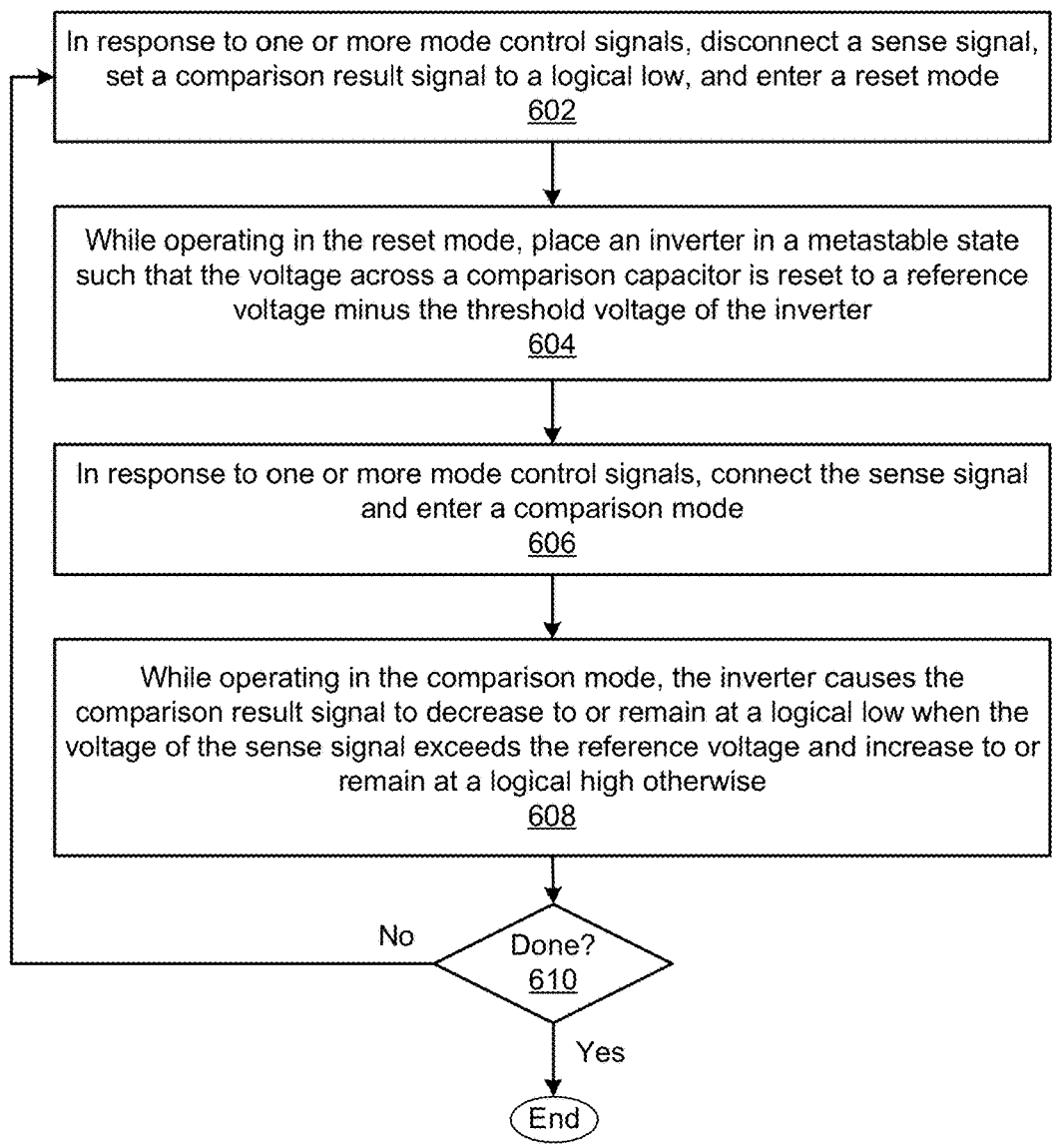
FIG. 6 is a flow diagram of method steps for comparing an input voltage to a reference voltage within an integrated circuit according to various embodiments.

FIG. 6 is a flow diagram of method steps for comparing an input voltage to a reference voltage within an integrated circuit, according to various embodiments. Although the method steps are described with reference to the systems of FIGS. 1-4B, persons skilled in the art will understand that any system configured to implement the method steps, in any order, falls within the scope of the present invention.

As shown, a method 600 begins at step 602, where, in response to one or more mode control signals, an asynchronous comparator (e.g., the asynchronous comparator 270(1), the asynchronous comparator 270(2), or any other instance of the asynchronous comparator) disconnects a sense signal, sets a comparison result signal to a logical low, and enters a reset mode. At step 604, while operating in the reset mode, the asynchronous comparator places an inverter in a metastable state such that the voltage across the comparison capacitor is reset to a reference voltage minus the threshold voltage of the inverter.

At step 606, in response to one or more mode control signals, the asynchronous comparator connects the sense signal and enters a comparison mode. At step 608, while operating in the comparison mode, the inverter causes the comparison result signal to decrease to or remain at a logical low when the voltage of the sense signal exceeds the reference voltage and to increase to or remain at a logical high otherwise.

At step 610, the asynchronous comparator determines whether the asynchronous comparator has finished comparing voltages. If, at step 610, the asynchronous comparator determines that the asynchronous comparator has not finished comparing voltages, then the method 600 returns to step 602, where, in response to one or more mode control signals, the asynchronous comparator re-enters the reset mode. If, however, at step 610, the asynchronous comparator determines that the asynchronous comparator has finished comparing voltages, then the method 600 ends.

In sum, the disclosed techniques can be used to measure currents associated with any number and/or types of current sources, any number and/or types of current sinks, or any combination thereof across any number of integrated circuit dies without physically altering the integrated circuit dies. In some embodiments, one or more instances of a current monitor are spatially distributed across an integrated circuit die and connected via JTAG resources to a JTAG interface that includes, without limitation, JTAG test pads. Via the JTAG test pads, each instance of the current monitor can be configured to sequentially determine and store output counts that are proportional to currents generated by any number of currents sinks and/or current sources that can be selected via a multiplexer included in the current monitor. The currents can be compared via ratios of the corresponding output counts. In some embodiments, a current count for a known current can be measured via a current monitor and used to compute an aggregate constant of proportionality for the current monitor. The aggregate constant of proportionality can be used to convert current counts obtained via the associated current monitor to absolute current measurements.

In some embodiments, the current monitor includes, without limitation, configuration logic, device selection logic, a current-to-clock circuit, and a counter. The configuration logic acquires, without limitation, TCK and configuration bits via the JTAG test pads and the JTAG resources. Based on TCK and the configuration bits, the configuration logic repeatedly and sequentially converts any number of input currents to corresponding output counts.

In some embodiments, to generate an output count for an input current, the configuration logic determines values for $V_{REFL}$, $V_{REFH}$, $SEL_{MUX}$, $SEL_{PMOS}$, optionally $V_{GS}/V_{SG}$, and optionally $V_{DS}/V_{SD}$ in any technically feasible fashion (e.g., based on the configuration bits). Based on $SEL_{MUX}$, the device selection logic selects an input current associated with a current source or a current sink that is optionally connected to $V_{GS}/V_{SG}$ and/or $V_{DS}/V_{SD}$. The configuration logic configures the current-to-clock circuit to generate an output clock having a frequency that is proportional to the input current. After the current-to-clock circuit finishes initializing, the configuration logic enables and resets a counter included in the counter logic. After M cycles of TCK, where M can be any positive integer, the configuration logic disables the counter. The counter logic stores the output count generated by the counter in a JTAG data register that can be read via the JTAG test pads. The output count is proportional to the frequency of the output clock and therefore is proportional to the input current.

In some embodiments, the current-to-clock circuit operates two instances of a self-limiting current integrator in a ping-pong fashion via mode switches controlled by a non-overlapping two-phase clock that is generated by self-clocking logic. In phase 1, the switches configure the first self-limiting current integrator to operate in a monitor mode, and the second self-limiting current integrator to operate in a reset mode. In phase 2, the switches configure the first self-limiting current integrator circuit to operate in the reset mode, and the second self-limiting current integrator to operate in the monitor mode.

Each self-limiting current integrator includes, without limitation, a current integrator and an asynchronous comparator. In some embodiments, the current integrator includes, without limitation, multiple mode switches, an operational amplifier, and an integration capacitor. If $SEL_{PMOS}$ is high, then the current integrator selects $V_{REFH}$ and $V_{REFL}$ as a reset voltage and a comparison voltage, respectively. If $SEL_{PMOS}$ is low, then the current integrator selects $V_{REFL}$ and $V_{REFH}$ as the reset voltage and the comparison voltage, respectively. Irrespective of the mode, a positive terminal of an operational amplifier is connected to $V_{DS}/V_{SD}$, and the current integrator outputs both the comparison voltage and an amplifier voltage that is connected to an output terminal of the operational amplifier.

When the current integrator is operating in the reset mode, the input current is unused, the integration capacitor is connected between the reset voltage and a negative terminal of the operational amplifier, and the output terminal of the operational amplifier is fed back to the negative terminal of the operational amplifier. As the current integrator operates in the reset mode, the integration capacitor discharges, and the operational amplifier adjusts the amplifier voltage to $V_{GS}/V_{SG}$.

When the asynchronous comparator is operating in the reset mode, the output of the asynchronous comparator is tied low. A comparison capacitor is connected between the comparison voltage and the input of an inverter. The output of the inverter is fed back to the input of the inverter to place the inverter in a metastable state. As the asynchronous comparator operates in the reset mode, the comparison capacitor stores a reset charge corresponding to the difference between the comparison voltage and the threshold voltage of the inverter.

When the current integrator is operating in the monitor mode, the integration capacitor is in a feedback path between the negative terminal of the operational amplifier and the output terminal of the operational amplifier, and the input current charges the integration capacitor. As the input current charges the integration capacitor, the amplifier voltage linearly transitions from the reset voltage past the comparison voltage at a ramp rate that is proportional to the input current.

When the asynchronous comparator is operating in the monitor mode, the amplifier voltage is connected to one terminal of the comparison capacitor, the other terminal of the comparison capacitor is connected to the input of the inverter, and the output of the inverter is connected to the output of the asynchronous comparator. Because of the charge stored in the comparison capacitor during the preceding phase, if the amplifier voltage is less than the comparison voltage, then the inverter drives the output of the asynchronous comparator high Otherwise, the inverter drives the output of the asynchronous comparator low. When the amplifier voltage linearly transitions past the comparison voltage, the inverter toggles the output of the asynchronous comparator.

In response, the self-clocking logic causes the two-phase non-overlapping clock to switch phases and therefore the two instances of the self-limiting current integrator to swap modes. The self-clocking logic also inverts and/or buffers one of the phases of the two-phase non-overlapping clock to generate an output clock having a frequency that is proportional to $I_{IN}$. The current monitor routes the output clock to a clock input of the counter.

At least one technical advantage of the disclosed techniques relative to the prior art is that, with the disclosed techniques, current measurements for transistors can be obtained at different spatial locations across an integrated circuit die without damaging the integrated circuit die. In that regard, with the disclosed techniques, each instance of a relatively small current monitor can sequentially generate numerous output counts, where each output count is related to the magnitude of a different current by an aggregate constant of proportionality. Accordingly, a relatively small number of instances of the current monitor can be used to collect current measurements for many pairs of similarly-designed transistors at a relatively higher spatial granularity across each integrated circuit die. Another advantage of the disclosed techniques is that, because the inputs and outputs of each instance of the current monitor can be accessed via one or more existing pads, currents across transistors within integrated circuit dies can be measured without altering the silicon, which helps maintain overall yields. Further, because no physical failure analysis operations are performed with the disclosed techniques, the overall time required to obtain current measurements for transistors can be substantially reduced relative to prior art techniques. These technical advantages provide one or more technological improvements over prior art approaches.

1. In some embodiments, a current measurement circuit comprises a first integration capacitor having a first terminal that is coupled to a first terminal of a first switch and having a second terminal that is coupled to both a first input terminal of a first operational amplifier and a first terminal of a second switch, wherein a second terminal of the second switch is coupled to a first input current; the first operational amplifier having a second input terminal that is coupled to a first voltage and having a first output terminal that is coupled to both the second terminal of the first switch and a first terminal of a third switch; a first comparison capacitor having a first terminal that is coupled to a second terminal of the third switch and having a second terminal that is coupled to an input of a first inverter; and the first inverter having an output that is coupled to a first terminal of a fourth switch, wherein a second terminal of the fourth switch is coupled to a clocking circuit, wherein, during operation, the clocking circuit generates a two-phase clock having a frequency that is proportional to the input current, and the first switch, the second switch, the third switch, and the fourth switch are turned on during a first phase of the two-phase clock and are turned off during a second phase of the two-phase clock.

2. The current measurement circuit of clause 1, wherein device selection logic generates the first input current based on a plurality of configuration bits and a gate-source voltage or a source-gate voltage.

3. The current measurement circuit of clauses 1 or 2, wherein the first input current is associated with a PMOS transistor, and the first voltage comprises a drain-source voltage of the PMOS transistor.

4. The current measurement circuit of any of clauses 1-3, wherein the first input current is associated with a NMOS transistor, and the first voltage comprises a source-drain voltage of the NMOS transistor.

5. The current measurement circuit of any of clauses 1-4, wherein the clocking circuit further generates an output clock that is coupled to counter logic, and wherein, during operation, the counter logic generates an output count that is proportional to the input current.

6. The current measurement circuit of any of clauses 1-5, wherein the output count is coupled to a first input of resource logic, and an output of the resource logic is coupled to a first pad of a first integrated circuit that includes the current measurement circuit.

7. The current measurement circuit of any of clauses 1-6, wherein the output count enables an absolute current measurement of the first input current or a ratiometric current measurement of the first input current.

8. The current measurement circuit of any of clauses 1-7, wherein the output count enables an aggregate constant of proportionality associated with the current measurement circuit to be computed.

9. The current measurement circuit of any of clauses 1-8, wherein the counter logic is further coupled to at least one of a reset signal that is generated by configuration logic or an enable signal that is generated by the configuration logic.

10. The current measurement circuit of any of clauses 1-9, further comprising a fifth switch having a first terminal that is coupled to the output of the first inverter and having a second terminal that is coupled to the input of the first inverter, wherein, during operation, the fifth switch is turned off during the first phase of the two-phase clock and is turned on during the second phase of the two-phase clock.

11. The current measurement circuit of any of clauses 1-10, further comprising a fifth switch having a first terminal that is coupled to the first terminal of the first integration capacitor and having a second terminal that is coupled to a reset voltage, wherein, during operation, the fifth switch is turned off during the first phase of the two-phase clock and is turned on during the second phase of the two-phase clock.

12. The current measurement circuit of any of clauses 1-11, wherein the first input current is associated with a current source and the reset voltage is higher than a comparison voltage.

13. The current measurement circuit of any of clauses 1-12, wherein the first input current is associated with a current sink and the reset voltage is lower than a comparison voltage.

14. The current measurement circuit of any of clauses 1-13, wherein the first integration capacitor, the first operational amplifier, the first comparison capacitor, and the first inverter comprise a first self-limiting current integrator, and wherein the current measurement circuit further comprises a second self-limiting current integrator that is coupled to the clocking circuit.

15. In some embodiments, a method for measuring currents within an integrated circuit comprises determining a first current configuration based on one or more configuration bits; during a first phase, configuring a first self-limiting current integrator to operate in monitor mode and a second self-limiting current integrator to operate in a reset mode; in response to a first output voltage signal reaching or surpassing a first reference voltage, causing the first phase to terminate and a second phase to begin; during the second phase, configuring the first self-limiting current integrator to operate in the reset mode and the second self-limiting current integrator to operate in the monitor mode; and after a second output voltage signal reaches or surpasses the first reference voltage, generating a current measurement for the first current configuration.

16. The method of clause 15, wherein determining the first current configuration comprises determining a first input current by selecting a current source, a current sink, an internal connection, or an external connection based on the one or more configuration bits.

17. The method of clauses 15 or 16, wherein configuring the first self-limiting current integrator to operate in the monitor mode comprises causing the first input current to charge a first integration capacitor included in the first self-limiting current integrator in order to generate the first output voltage signal.

18. The method of any of clauses 15-17, wherein generating the current measurement for the first current configuration comprises generating a first output clock having a frequency that is proportional to the first input current based on at least one of the first output voltage signal or the second output voltage signal.

19. The method of any of clauses 15-18, wherein generating the current measurement for the first current configuration comprises configuring counter logic to compute an output count based on at least one of the first output voltage signal or the second output voltage signal, wherein the output count is proportional to the first input current.

20. The method of any of clauses 15-19, wherein generating the current measurement for the first current configuration comprises determining an accumulated value of an output count associated with counter logic, and further comprising, prior to the first phase, resetting and enabling the counter logic to set an initial value of the output count to zero Any and all combinations of any of the claim elements recited in any of the claims and/or any elements described in this application, in any fashion, fall within the contemplated scope of the embodiments and protection.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program codec embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory, a read-only memory, an erasable programmable read-only memory, Flash memory, an optical fiber, a portable compact disc read-only memory, an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A current measurement circuit, comprising:
   a first integration capacitor having a first terminal that is coupled to a first terminal of a first switch and having a second terminal that is coupled to both a first input terminal of a first operational amplifier and a first terminal of a second switch, wherein a second terminal of the second switch is coupled to a first input current;
   the first operational amplifier having a second input terminal that is coupled to a first voltage and having a first output terminal that is coupled to both the second terminal of the first switch and a first terminal of a third switch;
   a first comparison capacitor having a first terminal that is coupled to a second terminal of the third switch and having a second terminal that is coupled to an input of a first inverter; and
   the first inverter having an output that is coupled to a first terminal of a fourth switch, wherein a second terminal of the fourth switch is coupled to a clocking circuit,
   wherein, during operation, the clocking circuit generates a two-phase clock having a frequency that is proportional to the input current, and the first switch, the second switch, the third switch, and the fourth switch are turned on during a first phase of the two-phase clock and are turned off during a second phase of the two-phase clock.

2. The current measurement circuit of claim 1, wherein device selection logic generates the first input current based on a plurality of configuration bits and a gate-source voltage or a source-gate voltage.

3. The current measurement circuit of claim 1, wherein the first input current is associated with a PMOS transistor, and the first voltage comprises a drain-source voltage of the PMOS transistor.

4. The current measurement circuit of claim 1, wherein the first input current is associated with a NMOS transistor, and the first voltage comprises a source-drain voltage of the NMOS transistor.

5. The current measurement circuit of claim 1, wherein the clocking circuit further generates an output clock that is coupled to counter logic, and wherein, during operation, the counter logic generates an output count that is proportional to the input current.

6. The current measurement circuit of claim 5, wherein the output count is coupled to a first input of resource logic, and an output of the resource logic is coupled to a first pad of a first integrated circuit that includes the current measurement circuit.

7. The current measurement circuit of claim 5, wherein the output count enables an absolute current measurement of the first input current or a ratiometric current measurement of the first input current.

8. The current measurement circuit of claim 5, wherein the output count enables an aggregate constant of proportionality associated with the current measurement circuit to be computed.

9. The current measurement circuit of claim 5, wherein the counter logic is further coupled to at least one of a reset signal that is generated by configuration logic or an enable signal that is generated by the configuration logic.

10. The current measurement circuit of claim 1, further comprising:
    a fifth switch having a first terminal that is coupled to the output of the first inverter and having a second terminal that is coupled to the input of the first inverter,
    wherein, during operation, the fifth switch is turned off during the first phase of the two-phase clock and is turned on during the second phase of the two-phase clock.

11. The current measurement circuit of claim 1, further comprising:
    a fifth switch having a first terminal that is coupled to the the first terminal of the first integration capacitor and having a second terminal that is coupled to a reset voltage,
    wherein, during operation, the fifth switch is turned off during the first phase of the two-phase clock and is turned on during the second phase of the two-phase clock.

12. The current measurement circuit of claim 11, wherein the first input current is associated with a current source and the reset voltage is higher than a comparison voltage.

13. The current measurement circuit of claim 11, wherein the first input current is associated with a current sink and the reset voltage is lower than a comparison voltage.

14. The current measurement circuit of claim 1, wherein the first integration capacitor, the first operational amplifier, the first comparison capacitor, and the first inverter comprise a first self-limiting current integrator, and wherein the current measurement circuit further comprises a second self-limiting current integrator that is coupled to the clocking circuit.

15. A method for measuring currents within an integrated circuit, the method comprising:
    determining a first current configuration based on one or more configuration bits;
    during a first phase, configuring a first self-limiting current integrator to operate in monitor mode and a second self-limiting current integrator to operate in a reset mode;
    in response to a first output voltage signal reaching or surpassing a first reference voltage, causing the first phase to terminate and a second phase to begin;
    during the second phase, configuring the first self-limiting current integrator to operate in the reset mode and the second self-limiting current integrator to operate in the monitor mode; and
    after a second output voltage signal reaches or surpasses the first reference voltage, generating a current measurement for the first current configuration.

16. The method of claim 15, wherein determining the first current configuration comprises determining a first input current by selecting a current source, a current sink, an internal connection, or an external connection based on the one or more configuration bits.

17. The method of claim 16, wherein configuring the first self-limiting current integrator to operate in the monitor mode comprises causing the first input current to charge a first integration capacitor included in the first self-limiting current integrator in order to generate the first output voltage signal.

18. The method of claim 16, wherein generating the current measurement for the first current configuration comprises generating a first output dock having a frequency that is proportional to the first input current based on at least one of the first output voltage signal or the second output voltage signal.

19. The method of claim 16, wherein generating the current measurement for the first current configuration comprises configuring counter logic to compute an output count based on at least one of the first output voltage signal or the second output voltage signal, wherein the output count is proportional to the first input current.

20. The method of claim 15, wherein generating the current measurement for the first current configuration comprises determining an accumulated value of an output count associated with counter logic, and further comprising, prior to the first phase, resetting and enabling the counter logic to set an initial value of the output count to zero.

* * * * *

UNITED STATES PATENT AND TRADEMARK OFFICE
CERTIFICATE OF CORRECTION

PATENT NO. : 11,619,661 B1
APPLICATION NO. : 17/698879
DATED : April 4, 2023
INVENTOR(S) : Nishit Harshad Shah et al.

Page 1 of 1

It is certified that error appears in the above-identified patent and that said Letters Patent is hereby corrected as shown below:

In the Claims

Column 32, Claim 11, Line 22, please delete "the" before first terminal;

Column 33, Claim 18, Line 6, please delete "dock" and insert --clock--.

Signed and Sealed this
Twenty-seventh Day of June, 2023

*Katherine Kelly Vidal*

Katherine Kelly Vidal
*Director of the United States Patent and Trademark Office*